US012232325B2

United States Patent
Nakatsuka et al.

(10) Patent No.: US 12,232,325 B2
(45) Date of Patent: Feb. 18, 2025

(54) SEMICONDUCTOR STORAGE DEVICE

(71) Applicant: Kioxia Corporation, Tokyo (JP)

(72) Inventors: Keisuke Nakatsuka, Kobe Hyogo (JP); Yoshitaka Kubota, Sagamihara Kanagawa (JP); Tetsuaki Utsumi, Yokohama Kanagawa (JP); Yoshiro Shimojo, Yokohama Kanagawa (JP); Ryota Katsumata, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 661 days.

(21) Appl. No.: 17/462,854

(22) Filed: Aug. 31, 2021

(65) Prior Publication Data

US 2021/0399004 A1    Dec. 23, 2021

Related U.S. Application Data

(62) Division of application No. 16/559,380, filed on Sep. 3, 2019, now Pat. No. 11,121,147.

(30) Foreign Application Priority Data

Mar. 22, 2019    (JP) .................. 2019-055071

(51) Int. Cl.
  *H10B 43/10*    (2023.01)
  *H10B 41/10*    (2023.01)
  (Continued)

(52) U.S. Cl.
  CPC ............ *H10B 43/40* (2023.02); *H10B 41/10* (2023.02); *H10B 41/20* (2023.02); *H10B 41/35* (2023.02);
  (Continued)

(58) Field of Classification Search
  CPC ........ H10B 43/40; H10B 41/10; H10B 41/20; H10B 41/35; H10B 41/41; H10B 43/10;
  (Continued)

(56) References Cited

U.S. PATENT DOCUMENTS 10,115,730 B1    10/2018    Baraskar et al.
11,121,147 B2 *    9/2021    Nakatsuka ............. H10B 41/20
  (Continued)

FOREIGN PATENT DOCUMENTS

CN    107305894 A    10/2017
CN    108666323 A    10/2018
  (Continued)

OTHER PUBLICATIONS

Notice of Allowance on U.S. Appl. No. 16/559,380 DTD Apr. 23, 2021.

*Primary Examiner* — Eduardo A Rodela
(74) *Attorney, Agent, or Firm* — Foley & Lardner LLP

(57) ABSTRACT

A semiconductor storage device includes a first conductive layer, a second conductive layer, a third conductive layer, a contact plug, a memory trench extending between the second conductive layer and the third conductive layer. The memory trench is formed around the contact plug, and surrounds a first area in which the contact plug is disposed. A second area is separated from the first area and includes a pillar penetrating the first conductive layer. The second conductive layer extends between the first and second areas, and is connected to the first conductive layer. The third conductive layer is on the opposite side of the first area to the second area, and is connected to the first conductive layer.

6 Claims, 24 Drawing Sheets

(51) Int. Cl.
  *H10B 41/20*     (2023.01)
  *H10B 41/35*     (2023.01)
  *H10B 41/41*     (2023.01)
  *H10B 43/20*     (2023.01)
  *H10B 43/35*     (2023.01)
  *H10B 43/40*     (2023.01)

(52) U.S. Cl.
  CPC ............ *H10B 41/41* (2023.02); *H10B 43/10* (2023.02); *H10B 43/20* (2023.02); *H10B 43/35* (2023.02)

(58) Field of Classification Search
  CPC ........ H10B 43/20; H10B 43/35; H10B 43/27; H10B 43/50; G11C 16/0483
  See application file for complete search history.

(56) References Cited

U.S. PATENT DOCUMENTS

| | | |
|---|---|---|
| 2003/0095448 A1 | 5/2003 | Ichige et al. |
| 2009/0090959 A1 | 4/2009 | Nishihara et al. |
| 2009/0242967 A1 | 10/2009 | Katsumata et al. |
| 2011/0013454 A1 | 1/2011 | Hishida et al. |
| 2011/0175159 A1 | 7/2011 | Itagaki et al. |
| 2011/0216597 A1 | 9/2011 | Higashi et al. |
| 2012/0007167 A1 | 1/2012 | Hung et al. |
| 2012/0193705 A1 | 8/2012 | Lim et al. |
| 2013/0334591 A1 | 12/2013 | Matsuda |
| 2016/0225783 A1 | 8/2016 | Ishibashi |
| 2016/0275994 A1 | 9/2016 | Oh |
| 2017/0179151 A1 | 6/2017 | Kai et al. |
| 2017/0194255 A1 | 7/2017 | Oh |
| 2017/0263613 A1 | 9/2017 | Murakoshi et al. |
| 2017/0263619 A1 | 9/2017 | Nagashima et al. |
| 2017/0263631 A1 | 9/2017 | Fujiki et al. |
| 2017/0263637 A1 | 9/2017 | Sakata et al. |
| 2017/0271348 A1 | 9/2017 | Arai et al. |
| 2017/0309638 A1 | 10/2017 | Nagumo |
| 2018/0026045 A1 | 1/2018 | Hu |
| 2019/0081101 A1 | 3/2019 | Nakazawa et al. |
| 2019/0386018 A1* | 12/2019 | Watanabe .............. H10B 41/20 |

FOREIGN PATENT DOCUMENTS

| | | |
|---|---|---|
| KR | 20120004346 A | 1/2012 |
| KR | 20160111767 A | 9/2016 |

* cited by examiner

FIG. 3
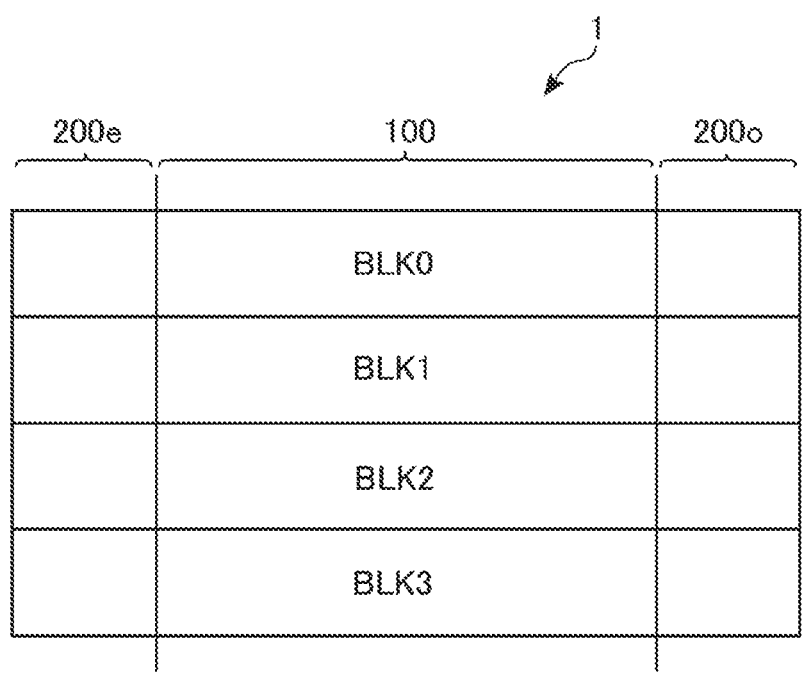
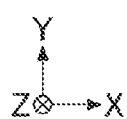

SEMICONDUCTOR STORAGE DEVICE

CROSS-REFERENCE TO RELATED APPLICATION(S)

This application is a Divisional of U.S. application Ser. No. 16/559,380 filed, Sep. 3, 2019, which is based upon and claims the benefit of priority from Japanese Patent Application No. 2019-055071, filed on Mar. 22, 2019, the entire contents of which are incorporated herein by reference.

FIELD

Embodiments described herein relate generally to a semiconductor storage device.

BACKGROUND

A semiconductor storage device in which memory cells are three-dimensionally arranged is known.

Example of related art includes US-A-2017/0271348.

DESCRIPTION OF THE DRAWINGS

FIG. 3 is a view illustrating an outline of a layout of a semiconductor storage device according to an embodiment.

DETAILED DESCRIPTION

Figure 1:
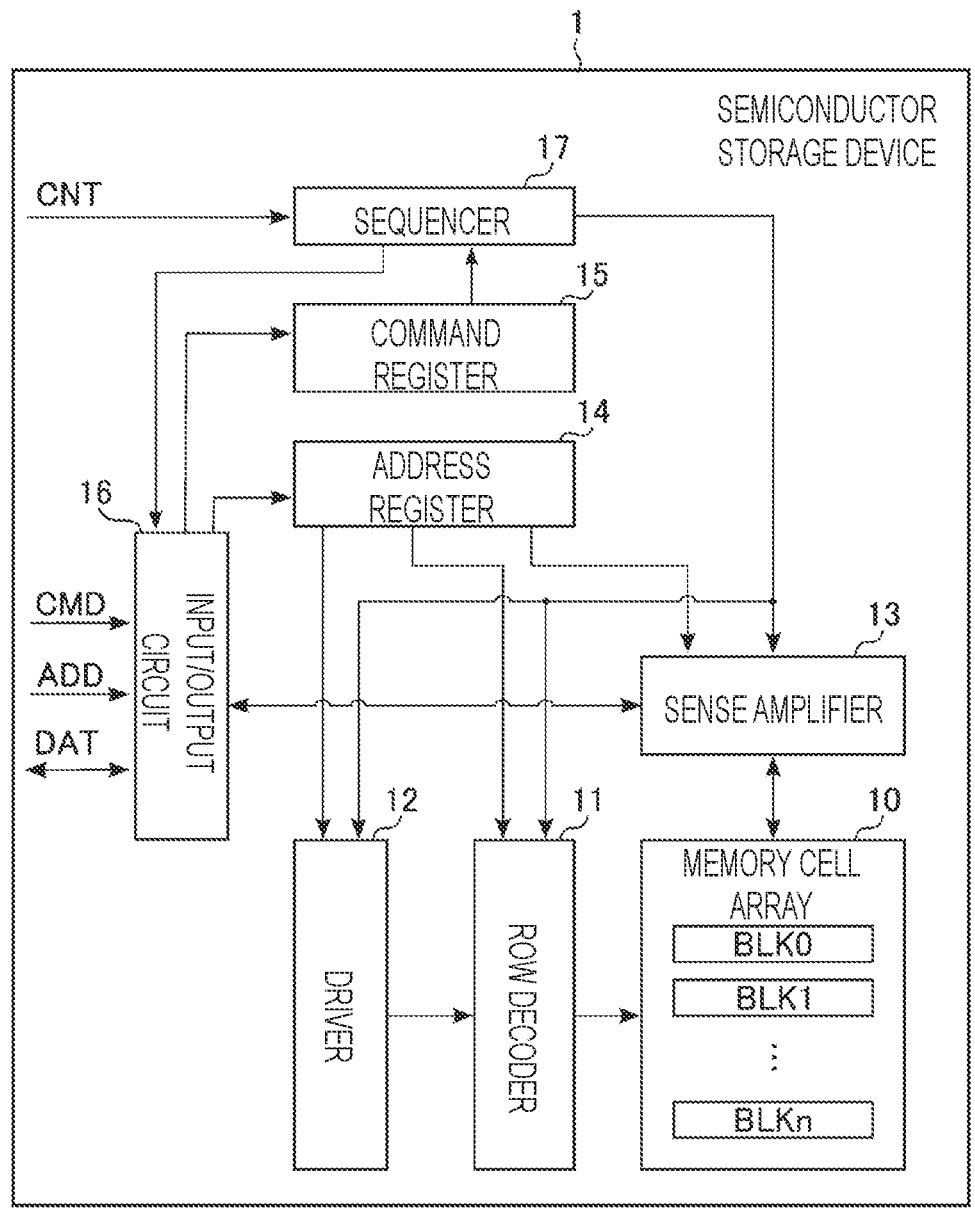
FIG. 1 is a block diagram illustrating a circuit configuration of a semiconductor storage device according to an embodiment.

Embodiments provide a semiconductor storage device of which an operation reliability may be improved.

In general, according to one embodiment, a semiconductor storage device includes: a first conductive layer that is stacked on a substrate in a first direction perpendicular to a surface of the substrate and extends in a second direction orthogonal to the first direction; a second conductive layer that is stacked on the substrate in the first direction, extends in the second direction, and is separated from the first conductive layer in a third direction orthogonal to the second direction; a third conductive layer that is stacked on the substrate in the first direction, extends in the second direction, and is separated from the first conductive layer in the third direction; a contact plug that is provided on the substrate and extends in the first direction; a first insulating layer that extends in the first direction between the second conductive layer and the third conductive layer, is continuously provided around the contact plug, and surrounds a first area in which the contact plug is disposed; and a second area that is separated from the first area in the second direction and includes a pillar penetrating the first conductive layer in the first direction. The second conductive layer extends in the second direction between the first area and the second area, further extends in the third direction, and is connected to the first conductive layer. The third conductive layer extends in the second direction on the opposite side of the first area to the second area, further extends in the third direction, and is connected to the first conductive layer.

Hereinafter, embodiments will be described with reference to the drawings. In the following descriptions, components having a similar function or configuration will be denoted by the same reference numerals. Further, each embodiment to be described hereinafter is an example of a device or a method for embodying the technical idea of the present disclosure, and does not limit materials, shapes, structures, arrangements and others of components to those described in the embodiment.

Each functional block may be implemented as hardware, computer software, or a combination thereof. The respective functional blocks may not be necessarily discriminated as in the examples described hereinafter. For example, some functions may be executed by other functional blocks than the illustrated function blocks. Furthermore, the illustrated functional blocks may be further divided into smaller functional sub-blocks. Herein, a three-dimensional stacking-type NAND flash memory in which memory cell transistors are stacked above a semiconductor substrate will be described as an example of the semiconductor storage device. In the descriptions herein, the memory cell transistors may be referred to as memory cells.

1. First Embodiment

A semiconductor storage device according to a first embodiment will be described below.

1.1 Circuit Block Configuration of Semiconductor Storage Device

First, the circuit block configuration of the semiconductor storage device according to the first embodiment will be described. The semiconductor storage device of the first embodiment is a NAND type flash memory capable of storing data in a nonvolatile manner.

FIG. 1 is a block diagram illustrating the circuit configuration of the semiconductor storage device of the first embodiment. The semiconductor storage device 1 includes a memory cell array 10, a row decoder 11, a driver 12, a sense amplifier 13, an address register 14, a command register 15, an input/output circuit 16, and a sequencer 17. For example, an external device (e.g., a host device or a controller) (not illustrated) is connected to the semiconductor storage device 1 via an external NAND bus.

1.1.1 Configuration of Each Block

The memory cell array 10 includes a plurality of blocks BLK0, BLK1, BLK2, . . . , and BLKn (n is an integer of 0 or more). Each of the plurality of blocks BLK0 to BLKn includes a plurality of memory cell transistors associated with rows and columns. Each of the memory cell transistors are able to store data in a nonvolatile manner and electrically rewrite data. In the memory cell array 10, a plurality of word lines, a plurality of bit lines, a source line and the like are arranged to control voltages applied to the memory cell transistors. Hereinafter, a block BLK refers to each of the blocks BLK0 to BLKn. Details of the memory cell array 10 and the block BLK will be described later.

The row decoder 11 receives a row address from the address register 14 and decodes the row address. The row decoder 11 selects one of the blocks BLK based on the decoding result of the row address, and further selects a word line in the selected block BLK. Furthermore, the row decoder 11 transfers a plurality of voltages necessary for a write operation, a read operation, and an erase operation to the memory cell array 10.

The driver 12 supplies a plurality of voltages to the selected block BLK via the row decoder 11.

The sense amplifier 13 detects and amplifies data read from a memory cell transistor into a bit line when data is read. Further, the sense amplifier 13 transfers write data DAT to a bit line when data is written.

The address register 14 stores an address ADD received from, for example, an external device. The address ADD includes a block address that specifies a block BLK of an operation target, and a page address that specifies a word line of an operation target in the specified block. The command register 15 stores a command CMD received from an external device. The command CMD includes, for example, a write command that instructs the sequencer 17 to perform a write operation, and a read command that instructs the sequencer 17 to perform a read operation.

The input/output circuit 16 is connected to an external device via a plurality of input/output lines (DQ lines). The input/output circuit 16 receives the command CMD and the address ADD from the external device. The input/output circuit 16 transmits the received command CMD to the command register 15, and transmits the received address ADD to the address register 14. Further, the input/output circuit 16 transmits and receives data DAT to and from the external device.

The sequencer 17 receives a control signal CNT from an external device. The control signal CNT includes a chip enable signal CEn, a command latch enable signal CLE, an address latch enable signal ALE, a write enable signal WEn, a read enable signal REn and the like. The "n" appended to a signal name indicates that the signal is a low active signal.

The sequencer 17 controls the operation of the semiconductor storage device 1 based on the command CMD stored in the command register 15 and the control signal CNT. Specifically, the sequencer 17 controls the row decoder 11, the driver 12, and the sense amplifier 13 based on a write command received from the command register 15 to perform a write into a plurality of memory cell transistors specified by the address ADD. The sequencer 17 also controls the row decoder 11, the driver 12, and the sense amplifier 13 based on a read command received from the command register 15 to perform a read from a plurality of memory cell transistors specified by the address ADD.

1.1.2 Circuit Configuration of Memory Cell Array 10

Next, the circuit configuration of the memory cell array 10 will be described. As described above, the memory cell array 10 includes the plurality of blocks BLK0 to BLKn. Here, a circuit configuration of one of the blocks, BLK, is described, and a circuit configuration of each of the other blocks is substantially similar.

Figure 2:
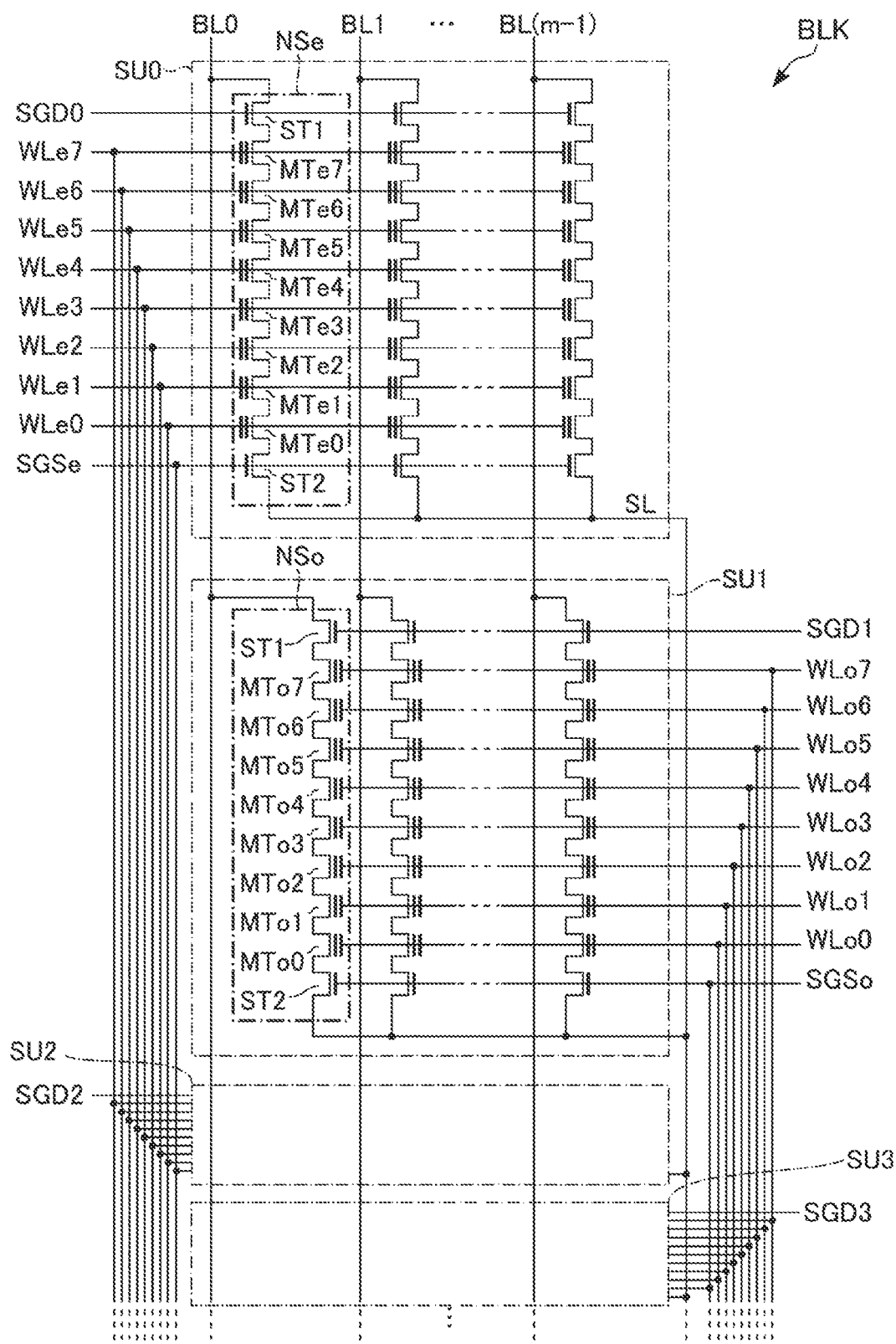
FIG. 2 is a circuit diagram of a block in a memory cell array according to an embodiment.

FIG. 2 is a circuit diagram of one block BLK in the memory cell array 10. The block BLK includes a plurality of string units. Here, a case where the block BLK includes string units SU0, SU1, SU2, . . . , and SU7 will be described as an example. Each of the string units SU0 to SU7 corresponds to one page which is, for example, a write unit. FIG. 2 illustrates the string units SU0 to SU3. Any number of string units can be included in the block BLK. Hereinafter, a string unit SU refers to each of the string units SU0 to SU7.

The string units SU0 to SU7 include the even-numbered string units SU0, SU2, SU4, and SU6 and the odd-numbered string units SU1, SU3, SU5, and SU7. Hereinafter, each of the even-numbered string units SU0, SU2, SU4, and SU6 will be denoted by SUe, and each of the odd-numbered string units SU1, SU3, SU5 and SU7 is denoted by SUo.

The even-numbered string unit SUe includes a plurality of NAND strings NSe. The odd-numbered string unit SUo includes a plurality of NAND strings NSo. When the NAND strings NSe and NSo are not distinguished from each other, each NAND string will be referred to as a NAND string NS.

The NAND string NS includes, for example, eight memory cell transistors MT0, MT1, MT2, . . . , and MT7, and select transistors ST1 and ST2. Here, a case where the NAND string NS includes eight memory cell transistors is described as an example, but any number of memory cell transistors can be included in the NAND string NS.

Each of the memory cell transistors MT0 to MT7 includes a control gate and a charge storage layer, and stores data in a nonvolatile manner. The memory cell transistors MT0 to MT7 are connected in series between the source of the select transistor ST1 and the drain of the select transistor ST2. The memory cell transistor MT may be of a metal-oxide-nitride-oxide-silicon (MONOS) type using an insulating film as the charge storage layer, or a floating gate (FG) type using a conductive layer as the charge storage layer. Hereinafter, a memory cell transistor MT refers to each of the memory cell transistors MT0 to MT7.

The gates of the select transistors ST1 in the respective string units SU0 to SU7 are connected to select gate lines SGD0, SGD1, SGD2, . . . , SDG7, respectively. Each of the select gate lines SGD0 to SGD7 is independently controlled by the row decoder 11.

The gate of the select transistor ST2 in each of the even-numbered string units SU0, SU2, . . . , and SU6 is connected to, for example, a select gate line SGSe. The gate of the select transistor ST2 in each of the odd-numbered string units SU1, SU3, . . . , and SU7 is connected to, for example, a select gate line SGSo. For example, the select gate lines SGSe and SGSo may be connected to each other to be the same wire, or may be separate wires.

In addition, the control gates of the memory cell transistors MT0 to MT7 in the string units SUe in the same block BLK are connected to word lines WLe0, WLe1, WLe2, . . . , and WLe7, respectively. Meanwhile, the control gates of the memory cell transistors MT0 to MT7 in the string units SUo are connected to word lines WLo0, WLo1, WLo2, . . . , and WLo7, respectively. Each of the word lines WLe0 to WLe7 and WLo0 to WLo7 is independently controlled by the row decoder 11.

The block BLK is, for example, an erase unit of data. That is, data stored in the memory cell transistors MT in the same block BLK are collectively erased. In addition, data may be erased in the unit of the string unit SU or in the unit smaller than string unit SU.

Further, the drains of the select transistors ST1 of the NAND strings NS in the same column in the memory cell array 10 are connected to each corresponding bit line of the bit lines BL0 to BL(m−1). Here, m is a natural number of 1 or more. That is, each of the bit lines BL0 to BL(m−1) commonly connects the NAND strings NS to each other among the plurality of string units SU. Furthermore, the sources of the plurality of select transistors ST2 are connected to a source line SL.

That is, the string unit SU includes a plurality of NAND strings NS which are connected to the different bit lines BL and connected to the same select gate line SGD. In addition, the block BLK also includes the plurality of string units SUe which share the word lines WLe and the plurality of string units SUo which share the word lines WLo. Further, the memory cell array 10 includes the plurality of blocks BLK which share the bit lines BL.

In the memory cell array 10, the select gate lines SGS, the word lines WL, and the select gate lines SGD are stacked in an order above the semiconductor substrate, so as to form the memory cell array 10 in which the select transistors ST2, the memory cell transistors MT, and the select transistors ST1 are three-dimensionally stacked.

In addition, the memory cell array 110 may have other configurations. That is, the configuration of the memory cell array 110 is described in, for example, U.S. patent application Ser. No. 12/407,403 filed on Mar. 19, 2009 and entitled "THREE DIMENSIONAL STACKED NONVOLATILEN SEMICONDUCTOR MEMORY," Further, the configuration of the memory cell array is described in U.S. patent application Ser. No. 12/406,524 filed on Mar. 18, 2009 and entitled "THREE DIMENSIONAL STACKED NON-VOLATILEN SEMICONDUCTOR MEMORY," U.S. patent application Ser. No. 12/679,991 filed on Mar. 25, 2010 and entitled "NON-VOLATILEE SEMICONDUCTOR STORAGE DEVICE METHOD AND METHOD OF MANUFACTURING THE SAME," and U.S. patent application Ser. No. 12/532,030 filed on Mar. 23, 2009 and entitled "SEMICONDUCTOR MEMORY AND METHOD FOR MANUFACTURING SAME." These patent applications are hereby incorporated by reference in their entirety.

1.2 Layout and Structure of Semiconductor Storage Device

Next, the layout and structure of the semiconductor storage device 1 of the first embodiment will be described.

1.2.1 Outline of Layout and Structure of Semiconductor Storage Device

FIG. 3 is a schematic view of the layout of the semiconductor storage device of the first embodiment. In FIG. 3 and the subsequent figures, the two directions which are orthogonal to each other while being in parallel with the surface of the semiconductor substrate are defined as the X direction and the Y direction, respectively, and the direction orthogonal to a plane including the X direction and the Y direction (XY plane) is defined as a Z direction (stacking direction).

The semiconductor storage device 1 includes a memory array area 100 and hookup areas 200e and 200o. The hookup areas 200e and 200o are disposed at both ends of the memory array area 100 in the X direction such that the memory array area 100 is interposed between the hookup areas 200e and 200o in the X direction. That is, the hookup area 200e is disposed at one end of the memory array area 100 in the X direction, and the hookup area 200o is disposed at the other end of the memory array area 100 in the X direction.

The memory array area 100 includes the plurality of blocks BLK0 to BLKn, and FIG. 3 represents the blocks BLK0 to BLK3. The blocks BLK0 to BLK3 are arranged in an order in the Y direction.

1.2.1.1 Layout of Memory Array Area and Layout of Hookup Areas

Next, the layout of the memory array area 100 and the hookup areas 200e and 200o in the semiconductor storage device 1 will be described.

Figure 4:
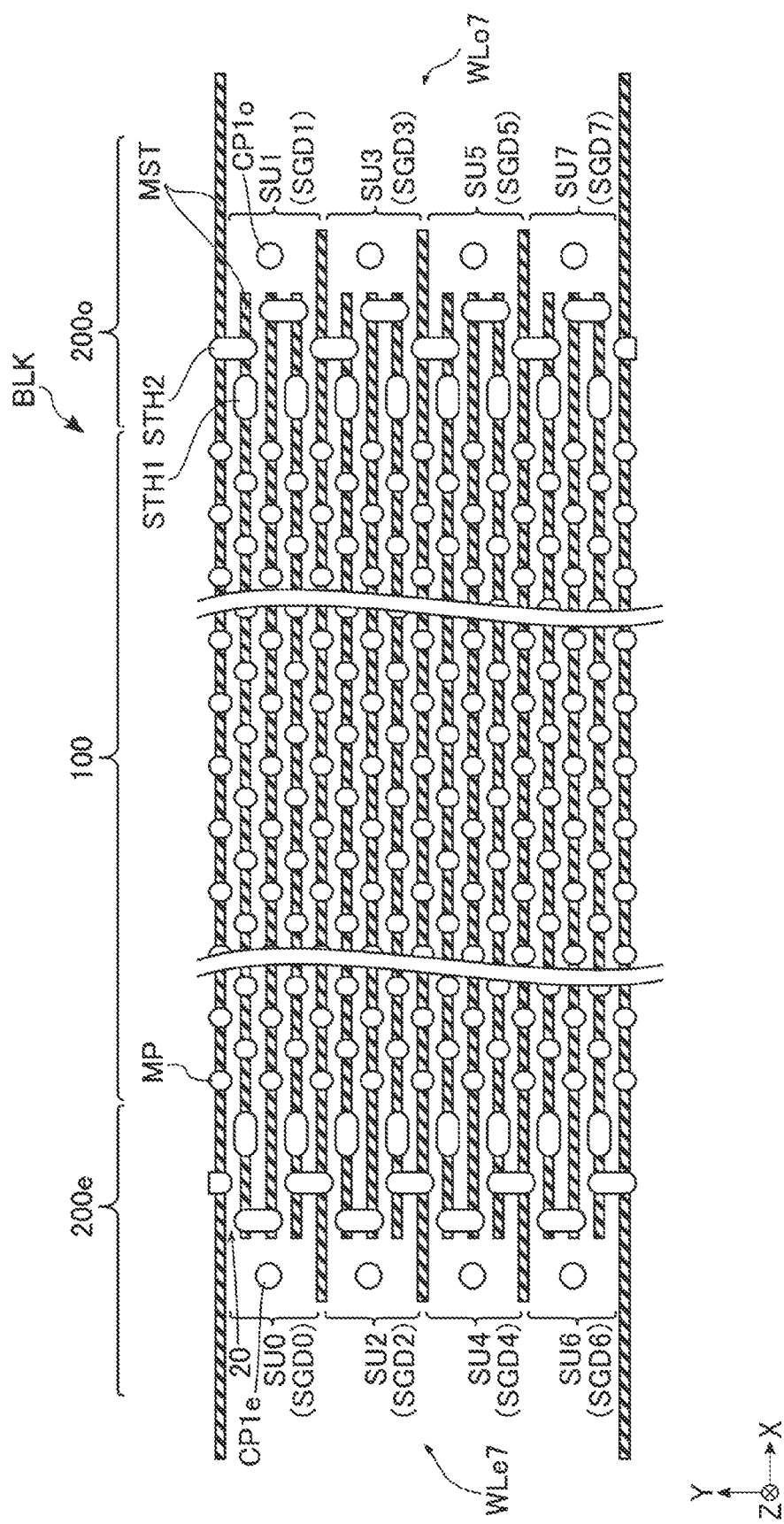
FIG. 4 is a plan view illustrating a portion of a memory array area and hookup areas according to an embodiment.

FIG. 4 is a view illustrating the outline of the block BLK in FIG. 3, and is a planar layout illustrating a portion of the memory array area 100 and the hookup areas 200e and 200o. To explain the outline of the layout of the block BLK, FIG. 4 omits a slit area and a contact area formed in the memory array area 100, and illustrates the layout of memory trenches MST, memory pillars MP, and select gate lines SGD (or word lines WL). The detailed layout of the memory array area 100 will be described later with reference to FIG. 10 and the subsequent figures.

As illustrated in FIG. 4, the memory array area 100 is provided, and the hookup areas 200e and 200o are provided at one end and the other end of the memory array area 100, respectively. In FIG. 4, the word line WLe7 of the word lines WLe0 to WLe7 is illustrated as an example, and the word line WLo7 of the word lines WLo0 to WLo7 is illustrated as an example.

The block BLK includes the string units SU0 to SU7 as described above. The extensions of the select gate lines SGD0, SGD2, SGD4, and SGD6 of the string units SU0, SU2, SU4 and SU6, that is, the string units SUe, and the word line WLe7 are provided in the hookup area 200e. Contact plugs CP1e connect the select gate lines SGD0, SGD2, SGD4, and SGD6, respectively, to an upper layer wire (not illustrated). The word line WLe7 is provided below the select gate lines SGD0, SGD2, SGD4, and SGD6.

The extensions of the select gate lines SGD1, SGD3, SGD5, and SGD7 of the string units SU1, SU3, SU5, and SU7, that is, the string units SUo, and the word line WLo7 are provided in the hookup area 200o. Contact plugs CP1o connect the select gate lines SGD1, SGD3, SGD5, and SGD7, respectively, to an upper layer wire (not illustrated). The word line WLo7 is provided below the select gate lines SGD1, SGD3, SGD5, and SGD7.

The block BLK includes a plurality of memory trenches MST, a plurality of memory pillars MP, a plurality of select gate lines SGD, and a plurality of word lines WL (not illustrated). The plurality of memory trenches MST extend in the X direction and are arranged at predetermined intervals in the Y direction. Each memory trench MST is an insulating area (or an insulating layer) and includes, for example, a silicon oxide layer.

The plurality of memory pillars MP are arranged in a staggered manner in the X direction and the Y direction on the plurality of memory trenches MST. That is, the plurality of memory pillars MP are arranged at predetermined intervals in the X direction on each memory trench MST. Assuming that two adjacent memory trenches MST are a first memory trench and a second memory trench, the memory pillars MP arranged on the second memory trench are arranged at positions shifted by half pitch from the memory pillars MP arranged on the first memory trench.

A conductive layer 20 is provided between adjacent memory trenches MST. The conductive layers 20 include conductive layers 20-0 to 20-15 to be described later. The conductive layers 20 are connected to each other in the hookup area 200e or 200o, and correspond to the select gate lines SGD. The word lines WLe7 and WLo7 are provided below the select gate lines SGD.

In the hookup areas 200e and 200o, slit areas STH1 are provided on the memory trenches MST. The slit areas STH1 are alternately arranged on the memory trenches MST arranged in the Y direction. Each slit area STH1 is an area in which an insulating material is embedded in a hole used in a replacement process for forming the conductive layers 20. The slit area STH1 is an insulating area (or insulating layer) and includes, for example, a silicon oxide layer.

In the hookup areas 200e and 200o, slit areas STH2 are provided on the memory trenches MST and the conductive layers 20. The slit areas STH2 are arranged in a staggered manner in the Y direction. Each slit area STH2 is an area in which an insulating material is embedded in a hole used in a replacement process for forming the conductive layers 20, and an area that isolates the conductive layers 20 into the select gate lines SGDe and SGDo in alternate and insulating manners. The replacement process is, for example, a process of removing sacrificial layers (e.g., insulating layers) present in areas where the word lines WL and the select gate lines SGD are to be disposed, and replacing the areas with conductive layers (e.g., tungsten (W)). The slit area STH2 is an insulating area (or insulating layer) and includes, for example, a silicon oxide layer.

In addition, in the hookup areas 200e and 200o, contact plugs are connected to the plurality of stacked word lines, respectively, but are omitted here.

1.2.1.2 Cross-Sectional Structures of Memory Array Area and Hookup Areas

Figure 5:
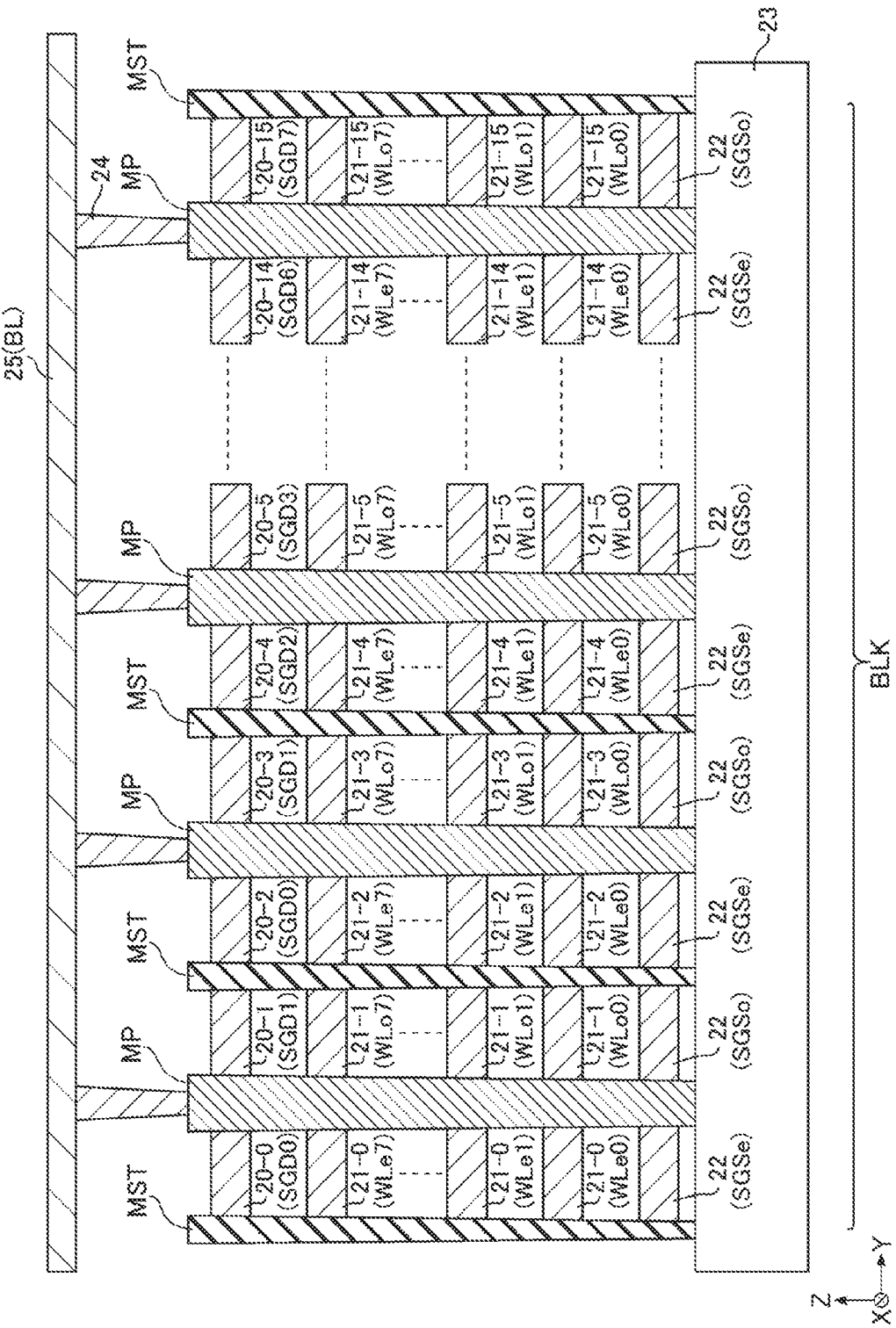
FIG. 5 is a cross-sectional view of a block which is taken along a Y direction according to an embodiment.

Next, the sectional structures of the memory array area 100 and the hookup areas 200e and 200o will be described. FIG. 5 is a cross-sectional view of the block BLK which is taken along the Y direction. In addition, the insulating layers between the conductive layers and on the conductive layers, and a peripheral circuit between the semiconductor substrate and the memory cell array are omitted.

As illustrated in FIG. 5, conductive layers 22 are provided above the semiconductor substrate (e.g., a p-type well area) 23. The conductive layers 22 function as the select gate lines SGSe and SGSo. Eight conductive layers 21 are stacked above the conductive layers 22 along the Z direction. Each conductive layer 21 includes conductive layers 21-0 to 21-15, and the eight conductive layers 21 function as the word lines WLe0 to WLe7 or WLo0 to WLo7.

The conductive layers 20 are provided above the conductive layers 21. The conductive layers 20 include the conductive layers 20-0 to 20-15, and function as the select gate lines SGD0 to SGD7.

The memory trenches MST and the memory pillars MP are alternately provided in the Y direction. The memory trenches MST and the memory pillars MP are extended in the Z direction so as to reach from the conductive layers 20 to a source line SL (not illustrated) below the conductive layers 22.

The conductive layers 22 are arranged such that a memory trench MST or a memory pillar MP is interposed between the conductive layers 22, and alternately function as the select gate line SGSe and SGSo. Similarly, the conductive layers 21 are arranged such that a memory trench MST or a memory pillar MP is interposed between the conductive layers 21, and alternately function as the word lines WLe and WLo.

Contact plugs 24 are provided on the memory pillars MP. Furthermore, a conductive layer 25 is provided on the contact plugs 24 along the Y direction. The conductive layer 25 functions as the bit line BL.

The cross section of the block BLK which is taken along the X direction will be described below.

Figure 6:
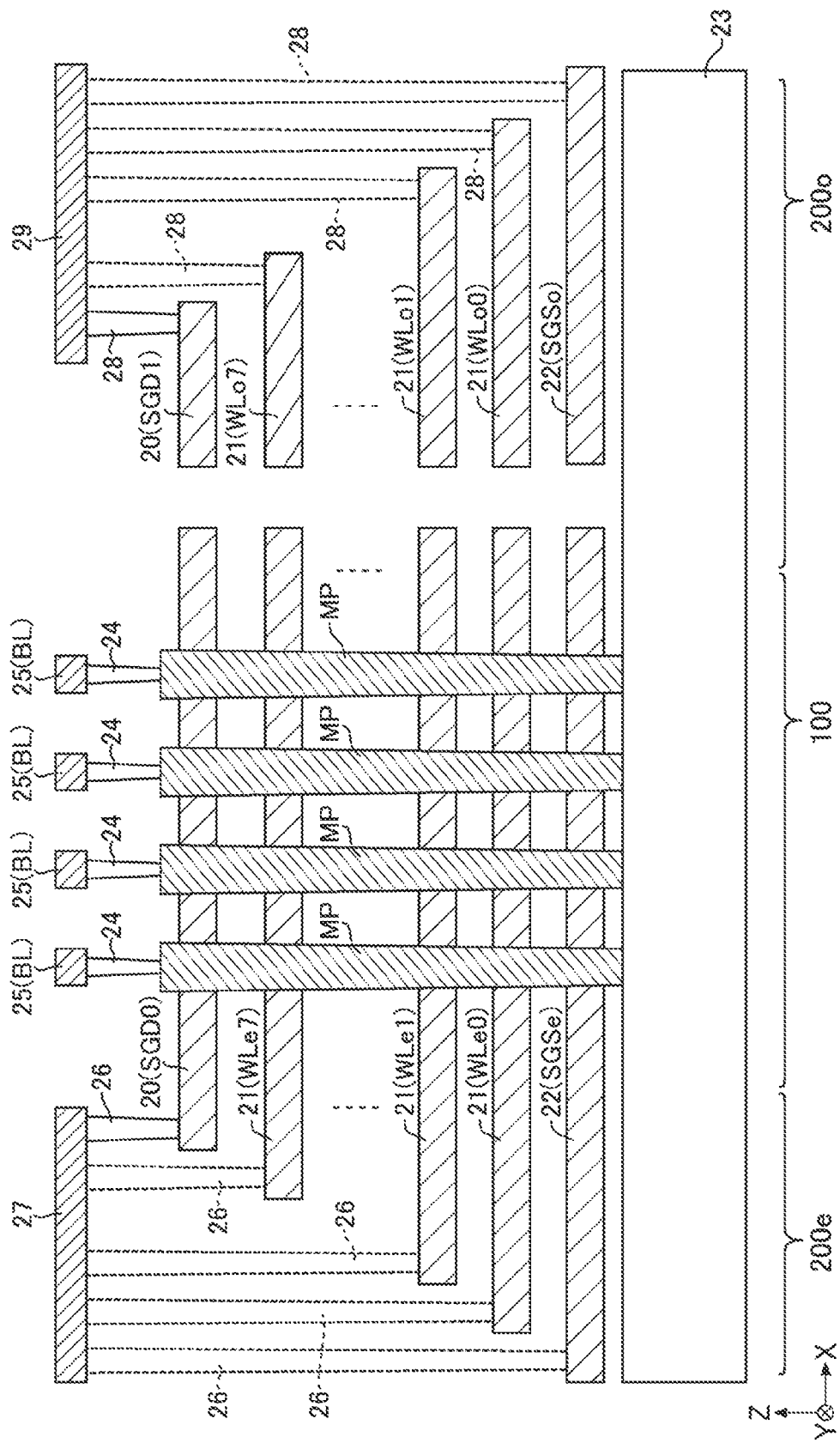
FIG. 6 is a cross-sectional view of a block which is taken along an X direction according to an embodiment.

FIG. 6 is a cross-sectional view of the block BLK which is taken along the X direction, and illustrates a cross-sectional structure of an area that passes the memory pillars MP along the select gate line SGD0 in FIG. 4, as an example. In addition, the insulating layers between the conductive layers and on the conductive layers, and a peripheral circuit between the semiconductor substrate and the memory cell array are omitted.

As described above with reference to FIG. 5, the conductive layers 22, 21, and 20 are provided in an order above the semiconductor substrate 23. In addition, the memory array area 100 is the same as described above with reference to FIG. 5.

As illustrated in FIG. 6, in the hookup area 200e, the conductive layers 20 to 22 extend, for example, in a step-like manner. That is, in the hookup area 200e, each of the conductive layers 20 to 22 has a terrace (or step-like) portion which does not overlap with the next higher conductive layer, when viewed in the XY plane or XZ plane. A contact plug 26 is provided on the terrace portion. In addition, the contact plug 26 is connected to a conductive layer 27. The contact plug 26 and the conductive layer 27 contain, for example, a metal such as tungsten (W).

By the plurality of conductive layers 27, the conductive layers 20 that function as the even-numbered select gate lines SGD0, SGD2, SGD4, and SGD6, the conductive layers 21 that function as the even-numbered word lines WLe, and the conductive layers 22 that function as the even-numbered select gate lines SGSe are electrically connected to the row decoder 11.

Similarly, in the hookup area 200o, the conductive layers 20 to 22 extend, for example, in a step-like manner. That is, in the hookup area 200o, each of the conductive layers 20 to 22 has a terrace portion which does not overlap with that of a conductive layer higher than the corresponding conductive layer, when viewed in the XY plane or XZ plane. A contact plug 28 is provided on the terrace portion. The contact plug 28 is connected to a conductive layer 29. The contact plug 28 and the conductive layer 29 contain, for example, a metal such as tungsten (W).

By the plurality of conductive layers 29, the conductive layers 20 that function as the odd-numbered select gate lines SGD1, SGD3, SGD5, and SGD7, the conductive layers 21 that function as the odd-numbered word lines WLo, and the conductive layers 22 that function as the odd-numbered select gate lines SGSo are electrically connected to the row decoder 11.

1.2.1.3 Cross-Sectional Structure of Memory Pillar MP

Figure 7:
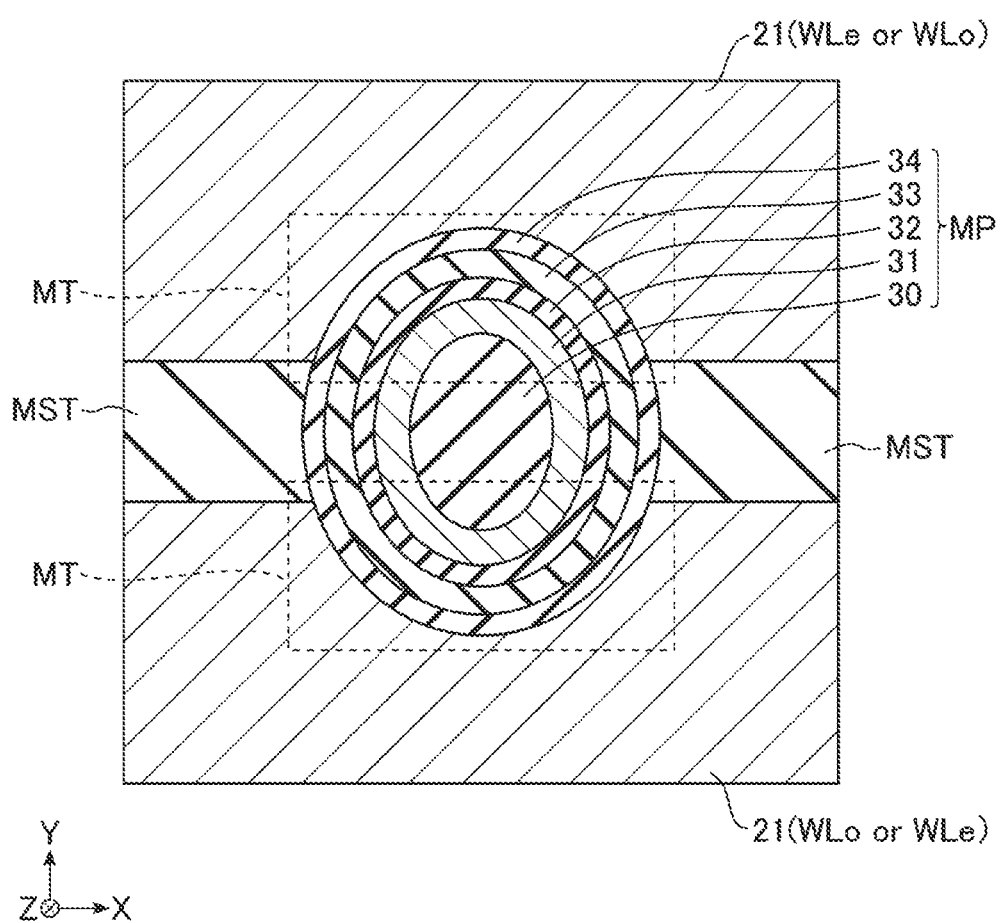
FIG. 7 is a cross-sectional view of a memory pillar which is taken along an XY plane according to an embodiment.
Figure 8:
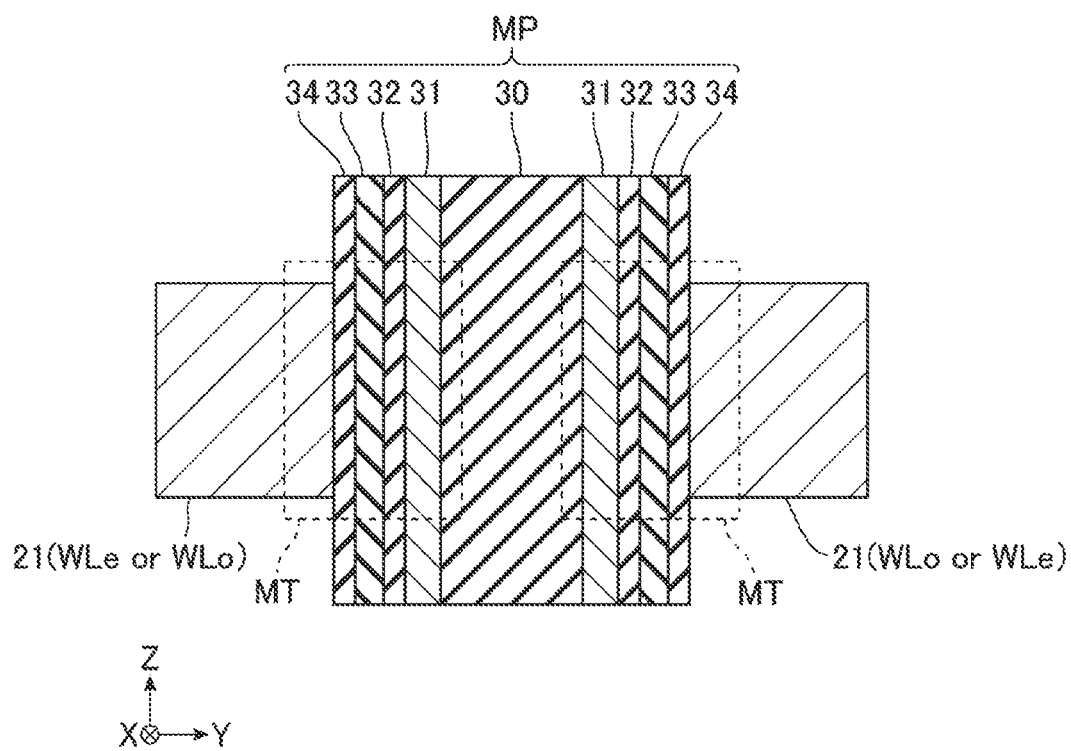
FIG. 8 is a cross-sectional view of a memory pillar which is taken along a YZ plane according to an embodiment.

Next, descriptions will be made on a structure and equivalent circuits of a memory pillar MP and memory cell transistors MT. FIG. 7 is a cross-sectional view of a memory pillar MP which is taken along the XY plane. FIG. 8 is a cross-sectional view of a memory pillar MP which is taken along the YZ plane. In particular, each of FIGS. 7 and 8 represents an area in which two memory cell transistors MT are provided.

As illustrated in FIGS. 7 and 8, the memory pillar MP includes an insulating layer 30, a semiconductor layer 31, and insulating layers 32 to 34. The word lines WLe and WLo include the conductive layer 21.

Each of the insulating layer 30, the semiconductor layer 31, and the insulating layers 32 to 34 extends along the Z direction. The insulating layer 30 is, for example, a silicon oxide layer. The semiconductor layer 31 surrounds the side surface of the insulating layer 30. The semiconductor layer 31 functions as an area in which a channel of a memory cell transistor MT is formed. The semiconductor layer 31 is, for example, a polycrystalline silicon layer.

The insulating layer 32 surrounds the side surface of the semiconductor layer 31. The insulating layer 32 functions as a gate insulating film of a memory cell transistor MT. The insulating layer 32 has a structure in which, for example, a silicon oxide layer and a silicon nitride layer are stacked. The insulating layer 33 surrounds the side surface of the insulating layer 32. The insulating layer 33 functions as a charge storage layer of a memory cell transistor MT. The insulating layer 33 is, for example, a silicon nitride layer. The insulating layer 34 surrounds the side surface of the insulating layer 33. The insulating layer 34 functions as a block insulating film of a memory cell transistor MT. The insulating layer 34 is, for example, a silicon oxide layer. An insulating layer such as, for example, a silicon oxide layer is embedded in the memory trench MST excluding the portion of the memory pillar MP.

According to the above-described configuration, two memory cell transistors MT are provided in one memory pillar MP along the Y direction, to be provided in the conductive layers 21, respectively. Each of the select transistors ST1 and ST2 has the same configuration.

Figure 9:
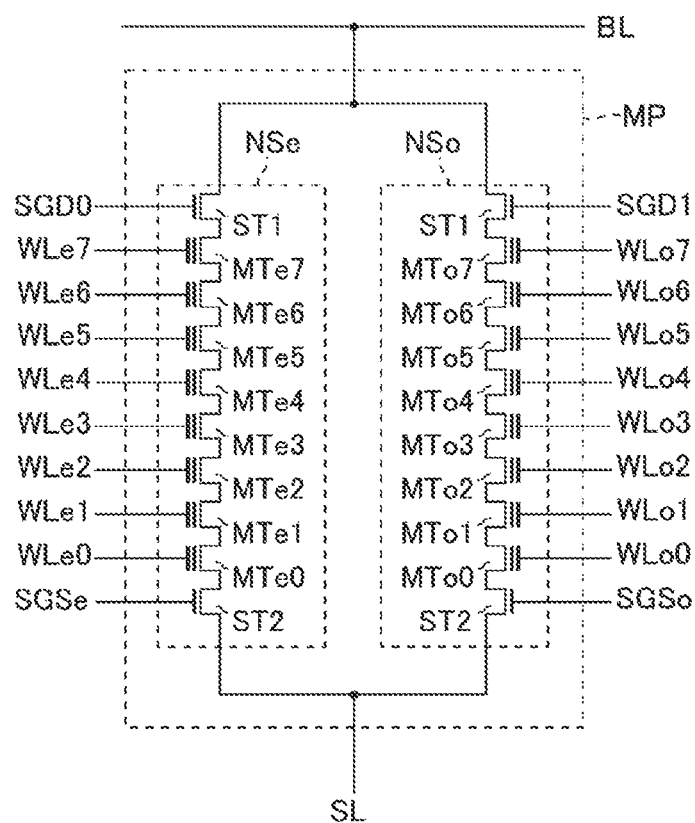
FIG. 9 is an equivalent circuit diagram of a memory pillar according to an embodiment.

In addition, equivalent circuits of the memory pillar MP will be described below. FIG. 9 is an equivalent circuit diagram of the memory pillar MP. As illustrated, two NAND strings NSe and NSo are provided in one memory pillar MP. That is, two select transistors ST1 provided in one memory pillar MP are connected to different select gate lines, for example, SGD0 and SGD1. Memory cell transistors MTe0 to MTe7 and MTo0 to MTo7 are connected to different word lines WLe and WLo, respectively. Further, the select transistors ST2 are also connected to different select gate lines SGSe and SGSo, respectively.

One ends of the two NAND strings NSe and NSo in the memory pillar MP are connected to the same bit line BL, and the other ends thereof are connected to the same source line SL. Furthermore, the two NAND strings NSe and NSo share a back gate (the semiconductor layer 31).

1.2.2 Details of Layout and Structure of Semiconductor Storage Device

Next, details of the layout and structure of the semiconductor storage device 1 of the first embodiment will be described.

Figure 10:
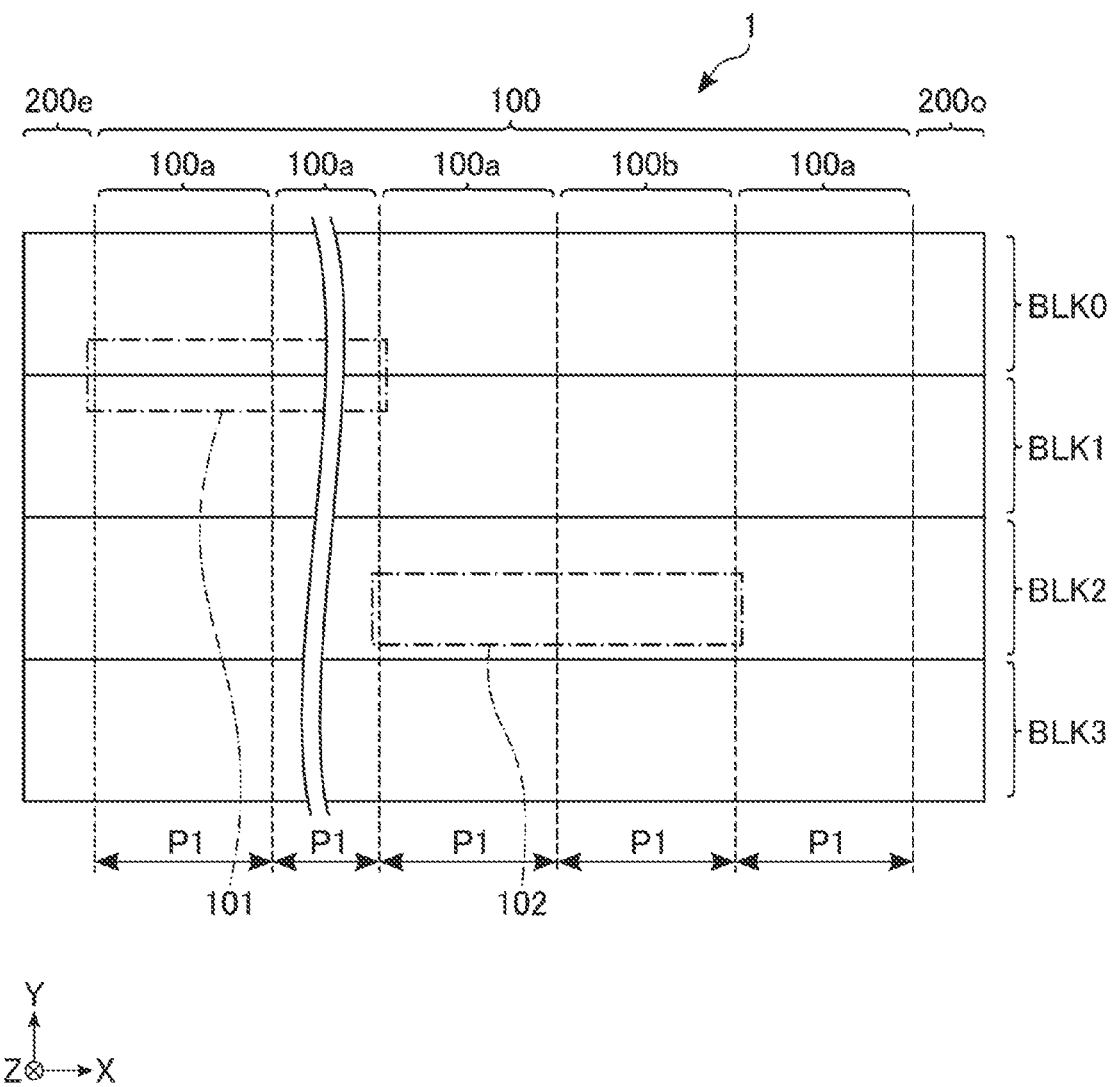
FIG. 10 is a view illustrating an outline of a layout of a semiconductor storage device according to an embodiment.

First, the outline of the layout of the semiconductor storage device 1 will be described in detail. FIG. 10 is a schematic view illustrating the layout of the semiconductor storage device 1.

As illustrated in FIG. 10, the hookup area 200e is disposed at one end of the memory array area 100 in the X direction, and the hookup area 200o is disposed at the other end of the memory array area 100 in the X direction. The blocks BLK0 to BLK3 are arranged in an order in the Y direction.

The memory array area 100 includes memory areas 100a and a contact area 100b. The memory array area 100 is divided into, for example, the respective memory areas 100a and the contact area 100b. The slit areas STH1 are arranged on the dashed lines that divide the areas 100a and 100b.

The memory pillars MP are arranged in a staggered manner in the memory areas 100a. One or more contact plugs are provided in the contact area 100b.

One or more contact plugs are also provided at the boundaries of the blocks BLK, for example, between the blocks BLK0 and BLK1 indicated by an area 101. An example in which the contact plugs are provided between the blocks BLK0 and BLK1 will be described later as a first example. Here, although an example in which the contact plugs are provided between the blocks BLK0 and BLK1 is illustrated, the contact plugs may be provided between any other blocks BLK.

Further, as described above, the contact plugs are provided in the contact area 100b disposed between the memory areas 100a. An example in which the contact plugs are provided in the contact area 100b will be described later as a second example.

In the present embodiment, an example in which the contact plugs are provided between the blocks BLK and in the contact area 100b is illustrated, but the contact plugs may be provided between the blocks BLK or in the contact area 100b. In addition, a plurality of contact areas 100b may be provided in the memory array area 100.

1.2.2.1 Details of Layout and Structure of Memory Array Area

Next, descriptions will be made on a planar layout of the memory array area 100 of the semiconductor storage device 1 according to the first embodiment.

a. First Example

Figure 11:
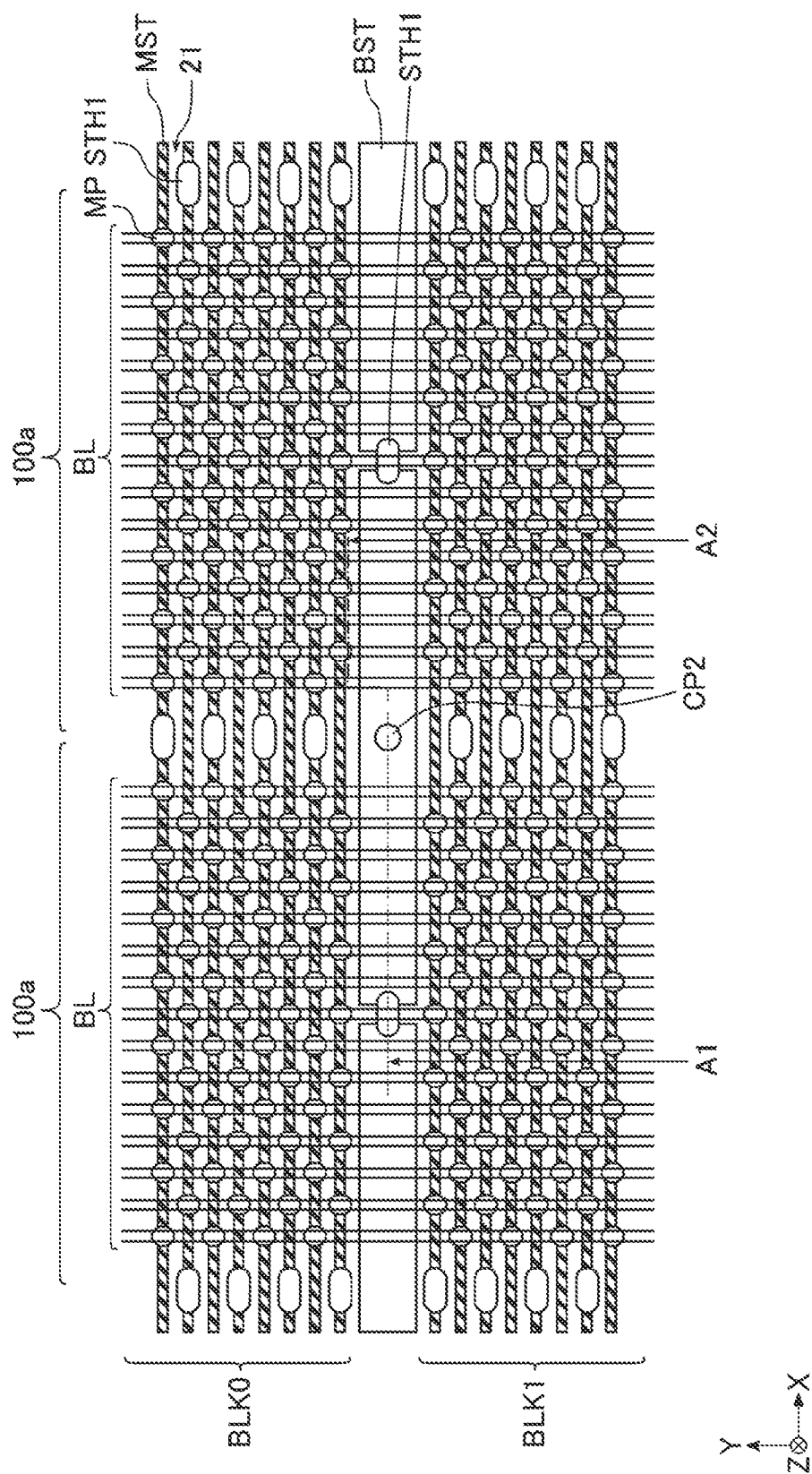
FIG. 11 is a planar layout illustrating a boundary of blocks according to a first example of a first embodiment.

FIG. 11 is a planar layout in which the area 101 illustrated in FIG. 10 is enlarged, and represents a boundary between the blocks BLK0 and BLK1 in the memory array area 100 (100a). FIG. 11 illustrates memory trenches MST, memory pillars MP, conductive layers 21, slit areas STH1, insulating areas BST, and a contact plug CP2.

As illustrated in FIG. 11, the blocks BLK0 and BLK1 are arranged in the Y direction. Each of the blocks BLK0 and BLK1 has a plurality of memory trenches MST, a plurality of memory pillars MP, a plurality of conductive layers 21 and a plurality of slit areas STH1. The insulating areas BST are provided between the blocks BLK0 and BLK1. The insulating areas BST will be described in detail later.

The layout of the memory trenches MST and the memory pillars MP is the same as that described above with reference to FIG. 4.

A conductive layer 21 is provided between adjacent memory trenches MST. The conductive layers 21 are connected to each other in the hookup area 200e or 200o, and correspond to the word lines WL.

The slit areas STH1 are provided on the memory trenches MST. The slit areas STH1 are alternately arranged on the memory trenches MST in the Y direction.

Each slit area STH1 is an area in which an insulating material is embedded in a hole used in a replacement process for forming the conductive layer 21. The slit area STH1 is an insulating layer and includes, for example, a silicon oxide layer. The arrangement of the slit areas STH1 will be described in detail later.

The insulating areas BST between the blocks BLK0 and BLK1 will be described below.

A plurality of insulating areas BST are provided between the blocks BLK0 and BLK1. The insulating areas BST have a predetermined length extending in the X direction and are arranged at predetermined intervals in the X direction. The width of each insulating area BST extending in the Y direction is longer than the width of each memory trench MST extending in the Y direction. A slit area STH1 is disposed between the insulating areas BST.

One or more contact plugs CP2 are provided in the insulating areas BST. In FIG. 11, the contact plug CP2 is disposed on a line in which the slit areas STH1 are arranged in the Y direction. That is, the contact plug CP2 is disposed on a line that passes through the slit areas STH1 along the Y direction. However, the position of the contact plug CP2 may be any position in the insulating areas BST as long as the position is not blocked by the bit lines BL.

The contact plug CP2 is connected between an upper layer wire above the memory array area 100 and a peripheral circuit provided below the memory array area 100. The peripheral circuit is provided between the semiconductor substrate 23 and the memory array area 100.

Furthermore, the bit lines BL are provided above the memory pillars MP, and the respective memory pillars MP are electrically connected to the bit lines BL.

Figure 12:
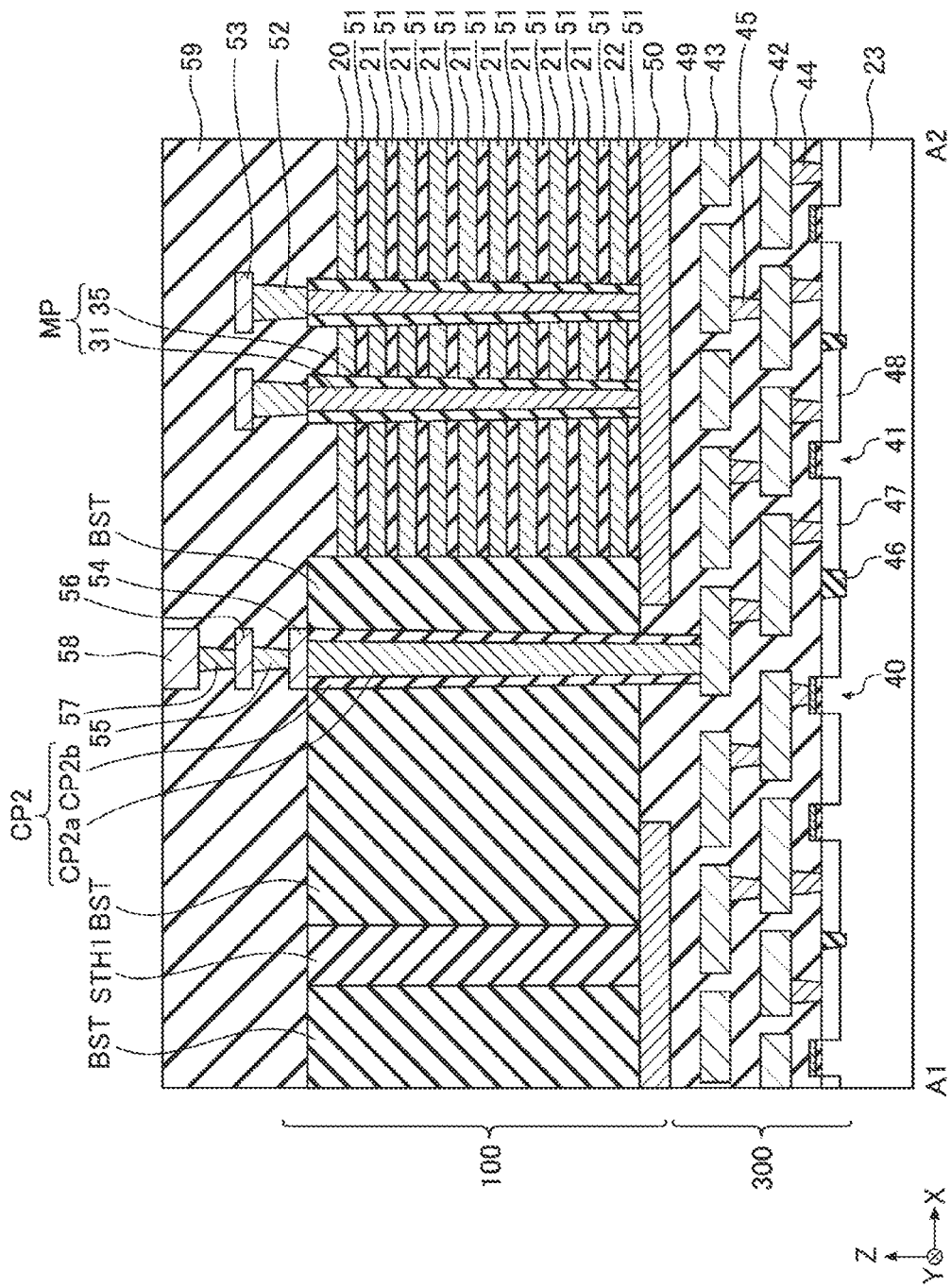
FIG. 12 is a cross-sectional view taken along line A1-A2 in FIG. 1.

Next, the cross-sectional structure of the area 101 in the memory array area 100 will be described. FIG. 12 is a cross-sectional view taken along line A1-A2 in FIG. 11, and illustrates the cross sections of the insulating areas BST, the contact plug CP2, and the stacked body including the conductive layers 20 and 21, the memory pillars MP and others.

As illustrated in FIG. 12, the semiconductor storage device 1 has a peripheral circuit area 300 provided on the semiconductor substrate 23, and a memory array area 100 provided on the peripheral circuit area 300. For example, a silicon semiconductor substrate is used as the semiconductor substrate 23.

The structure of the peripheral circuit area 300 will be described in detail below.

The peripheral circuit area 300 includes a peripheral circuit for controlling write, read, and erase of data on a memory cell transistor MT. For example, the peripheral circuit area 300 is an area for the row decoder 11, the driver 12, the sense amplifier 13, the address register 14, the command register 15, and the sequencer 17 (FIG. 1) to be disposed. Specifically, the peripheral circuit area 300 includes an n-channel MOS transistor (hereinafter, nMOS transistor) 40, a p-channel MOS transistor (hereinafter, pMOS transistor) 41, conductive layers 42 and 43, and contact plugs 44 and 45.

The nMOS transistor 40 and the pMOS transistor 41 are provided on the semiconductor substrate 23. An element isolation area (e.g., STI (shallow trench isolation)) 46 is provided between the nMOS transistor 40 and the pMOS transistor 41 to isolate the transistors from each other. The element isolation area 46 includes, for example, a silicon oxide layer.

The contact plug 44 is provided on a source area 47 or a drain area 48 of the nMOS transistor 40 or the pMOS transistor 41. The conductive layer 42 is provided on the contact plug 44. The contact plug 45 is provided on the conductive layer 42, and the conductive layer 43 is provided on the contact plug 45. Furthermore, a contact plug CP2 that extends in the Z direction is provided on the conductive layer 43.

The conductive layers 42 and 43 contain, for example, tungsten (W) and function as a wire or an electrode pad. The contact plugs 44 and 45 contain, for example, tungsten (W).

An insulating layer 49 is provided around the nMOS transistor 40, the pMOS transistor 41, the conductive layers 42 and 43, and the contact plugs 44 and 45. The insulating layer 49 includes, for example, a silicon oxide layer.

The structure of the memory array area 100 will be described in detail below.

The memory array area 100 has the memory cell array 10. Specifically, as illustrated in FIG. 12, the memory array area 100 includes conductive layers 20 to 22 and 50, insulating layers 51, memory pillars MP, a contact plug CP2, insulating areas BST, and a slit area STH1.

The conductive layer 50 is provided on the insulating layer 49. The conductive layer 50 functions as the source line SL. The conductive layer 50 contains, for example, polycrystalline silicon or tungsten (W).

The plurality of insulating layers 51 and the plurality of conductive layers 22, 21, and 20 are alternately stacked on the conductive layer 50. The stacked insulating layers 51 and conductive layers 22, 21, and 20 will be referred to as a stacked body. The conductive layers 22, 21, and 20 extend in the X direction. The conductive layer 22 functions as a select gate line SGS. Each conductive layer 21 functions as a word line WL. The conductive layer 20 functions as a select gate line SGD. The conductive layers 22, 21, and 20 contain, for example, tungsten (W). Each insulating layer 51 includes, for example, a silicon oxide layer.

The columnar memory pillars MP that extend in the Z direction are provided on the insulating layers 51 and the conductive layers 22, 21, and 20 (i.e., the stacked body). The lower end of each memory pillar MP is connected to the conductive layer 50 (the source line SL). A contact plug 52 that extends in the Z direction is provided on the upper end of the memory pillar MP, and a conductive layer 53 is provided on the contact plug 52. That is, the memory pillar MP reaches the source line SL from the lower end of the contact plug 52 through the select gate line SGD, the word lines WL0 to WL7, the select gate line SGS, and the plurality of insulating layers 51.

The memory pillar MP has a semiconductor layer 31 and a cell insulating layer 35. The cell insulating layer 35 includes insulating layers 32 to 34. Details of the memory pillar MP shall be referred to the descriptions with reference to FIGS. 7 and 8.

The conductive layer 53 functions as, for example, a bit line BL. The contact plug 52 and the conductive layer 53 contain, for example, tungsten (W).

Further, as illustrated in FIG. 12, in the cross section of the insulating areas BST, the contact plug CP2 is provided between the insulating areas BST. The lower end of the contact plug CP2 is connected to the conductive layer 43 of the peripheral circuit. A conductive layer 54 is provided on the upper end of the contact plug CP2, and a contact plug 55 is provided on the conductive layer 54. Further, a conductive layer 56 is provided on the contact plug 55, and a contact plug 57 is provided on the conductive layer 56. Furthermore, a conductive layer 58 is provided on the contact plug 57. As a result, the contact plug CP2 electrically connects the conductive layer (upper layer wire) 58 and the conductive layer 43 of the peripheral circuit to each other.

The contact plug CP2 has a conductive layer CP2a and an insulating layer CP2b provided around the conductive layer CP2a. The conductive layer CP2a contains, for example, tungsten (W). The insulating layer CP2b includes, for example, a silicon oxide layer. The conductive layer 58 functions as an upper layer wire or an electrode pad. The conductive layers 54, 56, and 58 and the contact plugs 55 and 57 contain, for example, tungsten (W).

Further, in the cross section of the insulating areas BST, the slit area STH1 is provided between the insulating areas BST. The insulating area BST extends in a planar form along the XZ plane that passes through the X direction and the Z direction. Each insulating area BST extends from the upper layer of the conductive layer 20 to the conductive layer 50. The length of the insulating area BST in the Y direction is longer than the length of each memory trench MST in the Y direction. The insulating area BST includes, for example, a silicon oxide layer.

The slit area STH1 extends in the Z direction. The slit area STH1 extends from the upper layer of the conductive layer 20 to the conductive layer 50. The slit area STH1 includes, for example, a silicon oxide layer.

An insulating layer 59 is provided on the conductive layer 20, the insulating areas BST, and the slit area STH1. The insulating layer 59 covers the periphery of the conductive layers 53, 54, 56, and 58 and the contact plugs 52, 55, and 57. The insulating layer 59 includes, for example, a silicon oxide layer.

Next, a modification of the first example will be described with reference to FIG. 13.

Figure 13:
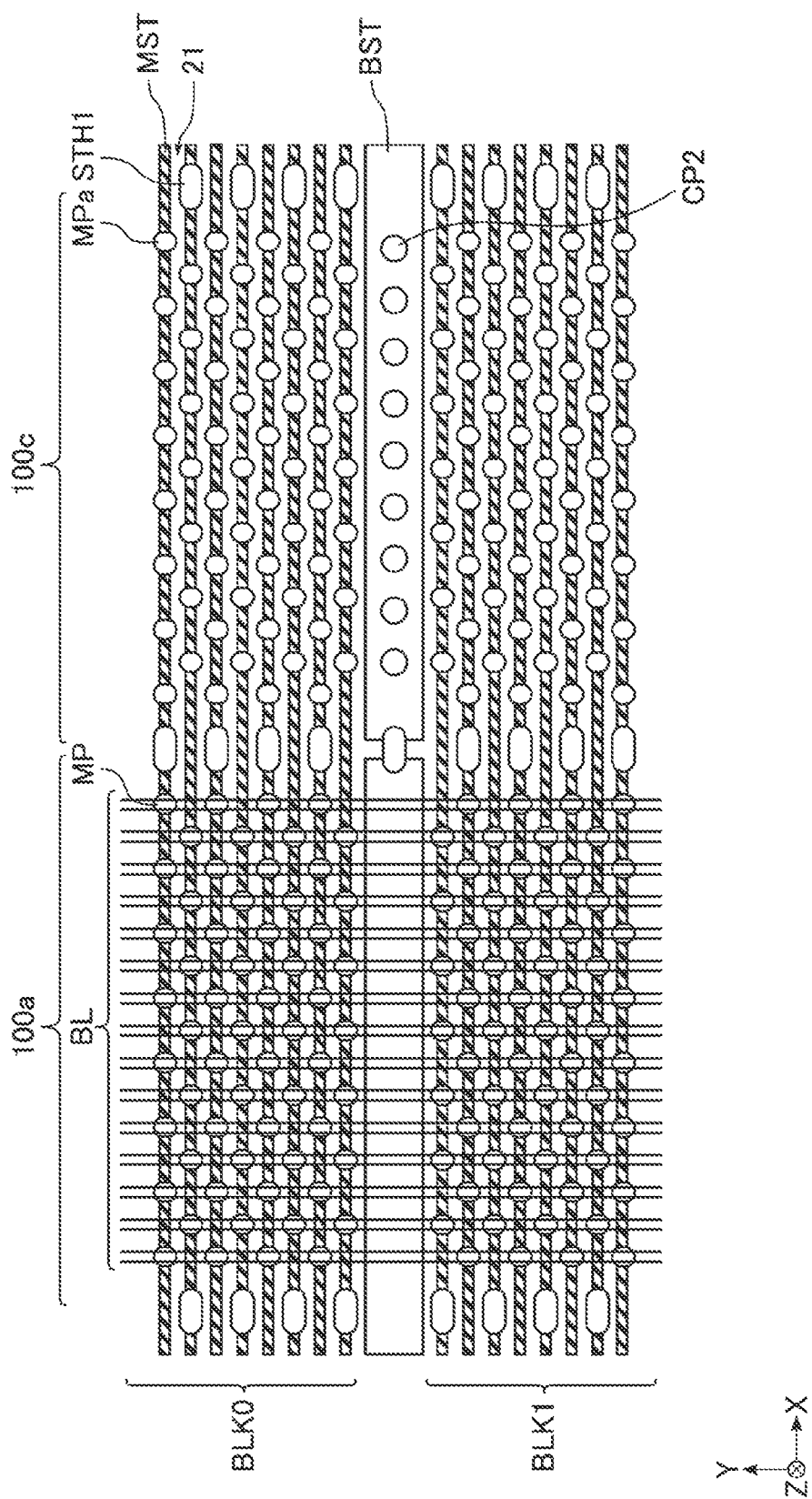
FIG. 13 is a planar layout illustrating a boundary of blocks according to a modification of the first example.

FIG. 13 illustrates a modification of the first example, and is a planar layout in which the area 101 is enlarged. FIG. 13 illustrates the boundary between the blocks BLK0 and BLK1 in the memory array area 100 (100a).

As illustrated in FIG. 13, a plurality of memory pillars MP are arranged in a staggered manner on the memory trenches MST in the memory area 100a. The upper ends of the memory pillars MP are connected to the bit lines BL, respectively. Insulating areas BST are provided between the blocks BLK0 and BLK1 in which the memory pillars MP are arranged.

Further, a plurality of dummy memory pillars MPa are arranged in a staggered manner on the memory trenches MST in another memory area 100c. The upper ends of the respective dummy memory pillar MPa are not connected to bit lines BL. That is, the dummy memory pillars MPa arranged in the memory area 100c have dummy memory cell transistors (hereinafter, dummy memory cells). The dummy memory cells are memory cells which are not used for a write, read or erase operation, and no bit lines BL are connected to the memory pillars MPa having the dummy memory cells.

The insulating areas BST are provided between the blocks BLK0 and BLK1 in which the dummy memory pillars MPa are arranged. One or more contact plugs CP2 are provided in the insulating areas BST between the blocks BLK in which the dummy memory pillars MPa are arranged. The contact plugs CP2 are arranged in the X direction. The contact plugs CP2 electrically connect the conductive layer (upper layer wire) 58 and the conductive layer 43 of the peripheral circuit to each other. The other configurations are the same as those of the first example.

b. Second Example

Figure 14:
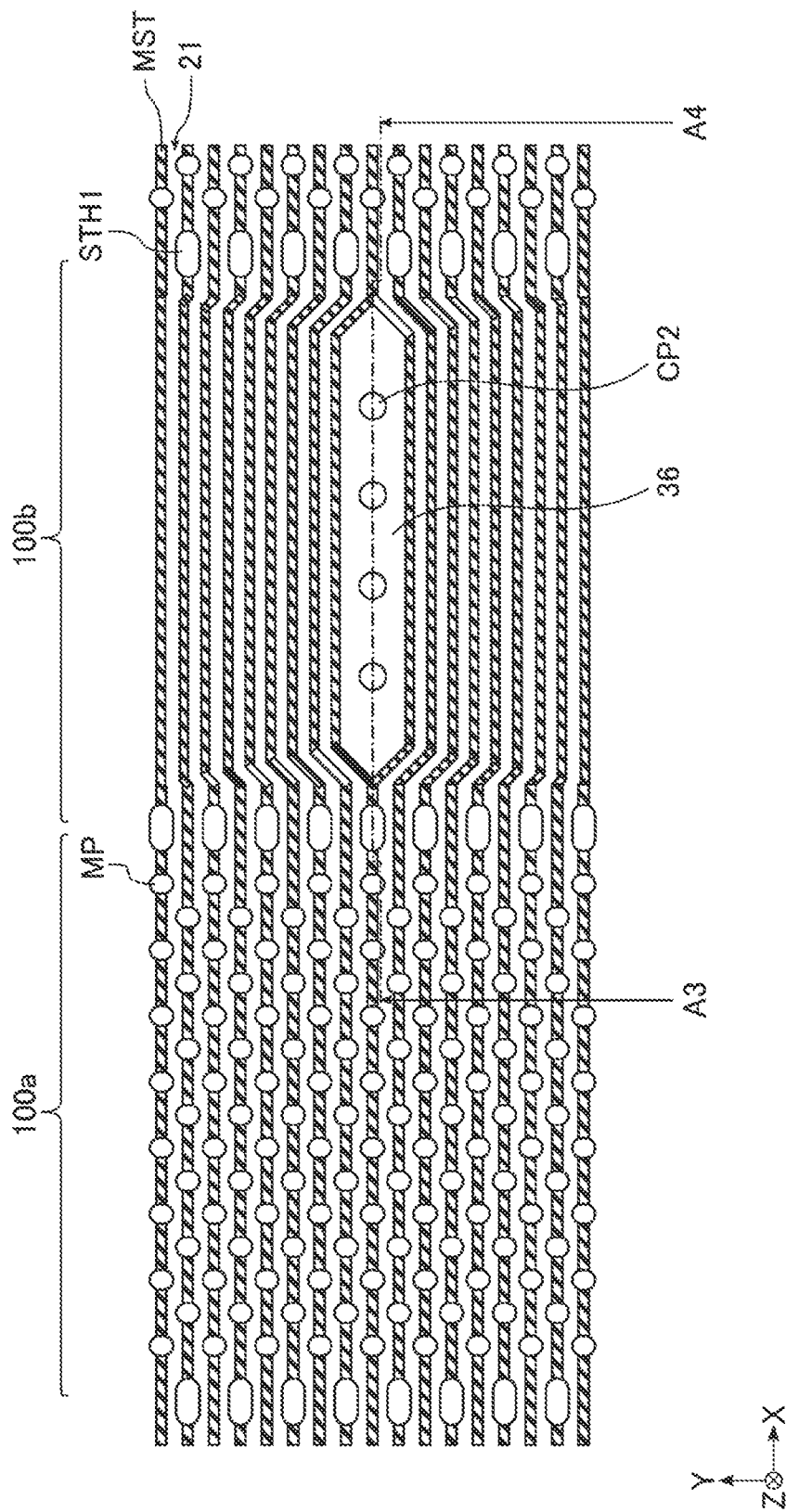
FIG. 14 is a planar layout illustrating a memory area and a contact area in a second example of the first embodiment.

FIG. 14 is a planar layout in which the area 102 illustrated in FIG. 10 is enlarged, and illustrates a memory area 100a and a contact area 100b.

As illustrated in FIG. 14, in the memory area 100a, a plurality of memory trenches MST extend in the X direction and are arranged at predetermined intervals in the Y direction. A plurality of memory pillars MP are arranged in a staggered manner in the X direction and the Y direction on the plurality of memory trenches MST.

A conductive layer 21 is provided between adjacent memory trenches MST. Slit areas STH1 are provided on the memory trenches MST at the boundary between the memory area 100a and the contact area 100b and at the boundary between the memory area 100a and another memory area 100a. The slit areas STH1 are alternately arranged on the memory trenches MST arranged in the Y direction.

In the contact area 100b, a plurality of memory trenches MST that extend in the X direction and in directions oblique to the X direction are arranged at predetermined intervals in the Y direction. Specifically, two memory trenches MST are arranged in a polygonal shape (e.g., a hexagonal shape, a quadrangular shape, or an elliptical shape) to surround a contact arrangement area 36. A plurality of memory trenches MST are arranged at predetermined intervals in the Y direction around the two memory trenches MST.

FIG. 14 illustrates an example in which the two memory trenches MST surround the contact arrangement area 36 in a hexagonal shape. In this case, each memory trench MST first extends in the X direction from the slit area STH1 disposed at one end of the contact area 100b, extends obliquely to the X direction, extends in the X direction, extends obliquely to the X direction to be axisymmetric with the first inclination, and further extends in the X direction to reach the slit area STH1 at the other end of the contact area 100b.

A plurality of contact plugs CP2 are arranged in the X direction in the contact arrangement area 36. Here, four contact plugs CP2 are represented as an example. The other configurations are the same as those of the first example.

In addition, no memory pillars MP are arranged in the contact area 100b.

Figure 15:
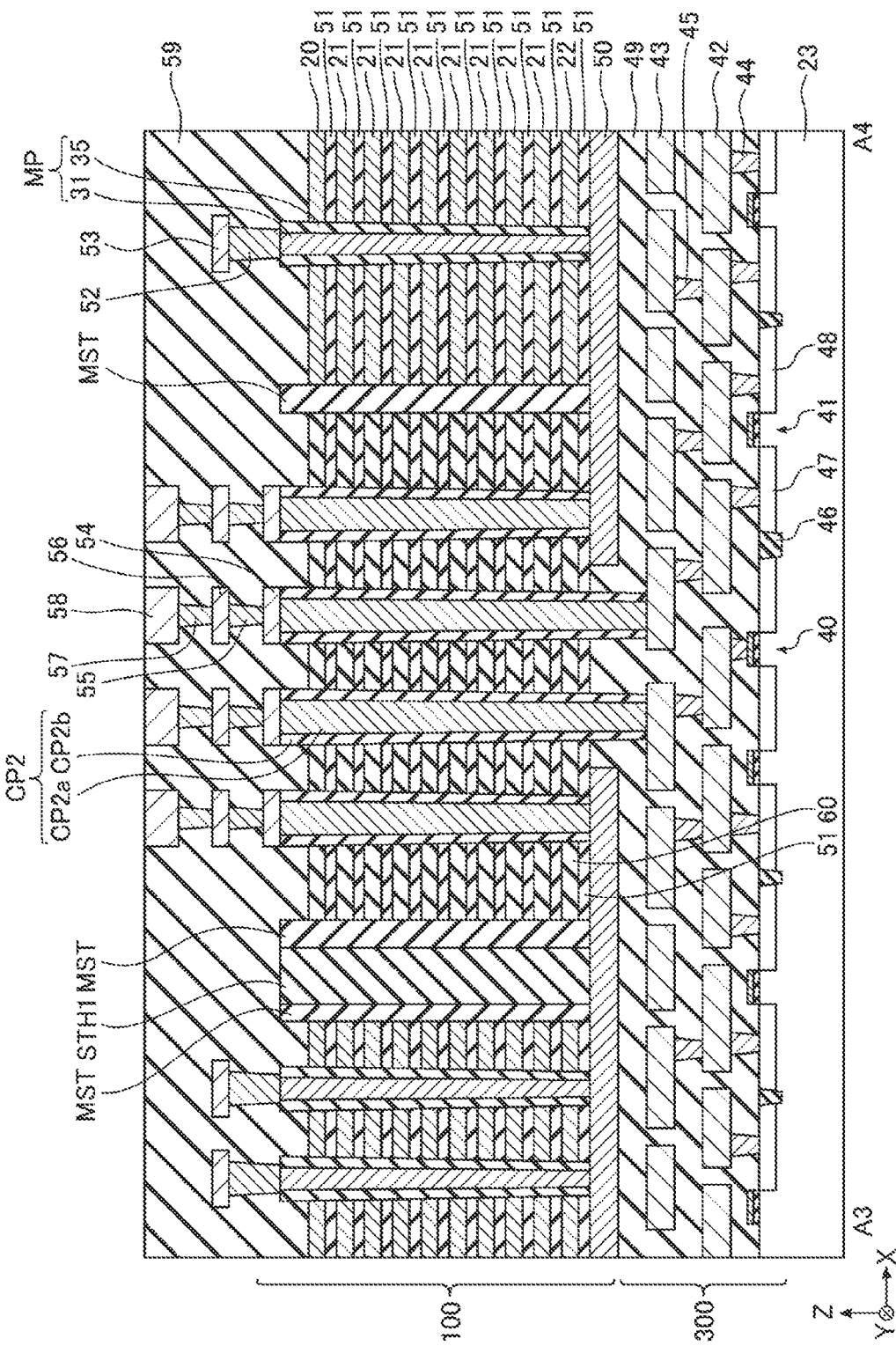
FIG. 15 is a cross-sectional view taken along line A3-A4 in FIG. 14.

Next, the cross-sectional structure of the area 102 in the memory array area 100 will be described. FIG. 15 is a cross-sectional view taken along line A3-A4 in FIG. 14, and illustrates the cross sections of the memory pillars MP, the stacked body including the conductive layers 20 and 21, the contact plugs CP2 and others.

As illustrated in FIG. 15, the semiconductor storage device 1 has a peripheral circuit area 300 provided on a semiconductor substrate 23, and a memory array area 100 provided on the peripheral circuit area 300. The structure of the peripheral circuit area 300 is the same as that of the first example.

The structure of the memory array area 100 will be described in detail below.

The structure of the memory area 100a in the memory array area 100 is the same as that of the first example.

For example, four contact plugs CP2 are provided in the contact arrangement area 36 within the contact area 100b. As illustrated in FIG. 15, the two central contact plugs CP2 electrically connect the conductive layer (upper layer wire) 58 and the conductive layer 43 of the peripheral circuit to each other. The lower and upper ends of the contact plugs CP2 are connected in the same manner as described in the first example.

The contact plugs CP2 disposed outside the two central contact plugs CP2, respectively, electrically connect the conductive layer 58 and the conductive layer 50 (the source line SL) to each other. The lower ends of the respective external contact plugs CP2 are connected to the conductive layer 50. A conductive layer 54, a contact plug 55, a conductive layer 56, a contact plug 57, and a conductive layer 58 are provided in an order on the upper end of each of the external contact plugs CP2.

In the cross section of the contact arrangement area 36 surrounded by the memory trenches MST, a plurality of insulating layers 51 and a plurality of sacrificial layers (e.g., insulating layers such as silicon nitride layers) 60 are alternately stacked on the insulating layer 49 or the conductive layer 50. The other structures are the same as those of the first example.

Figure 16:
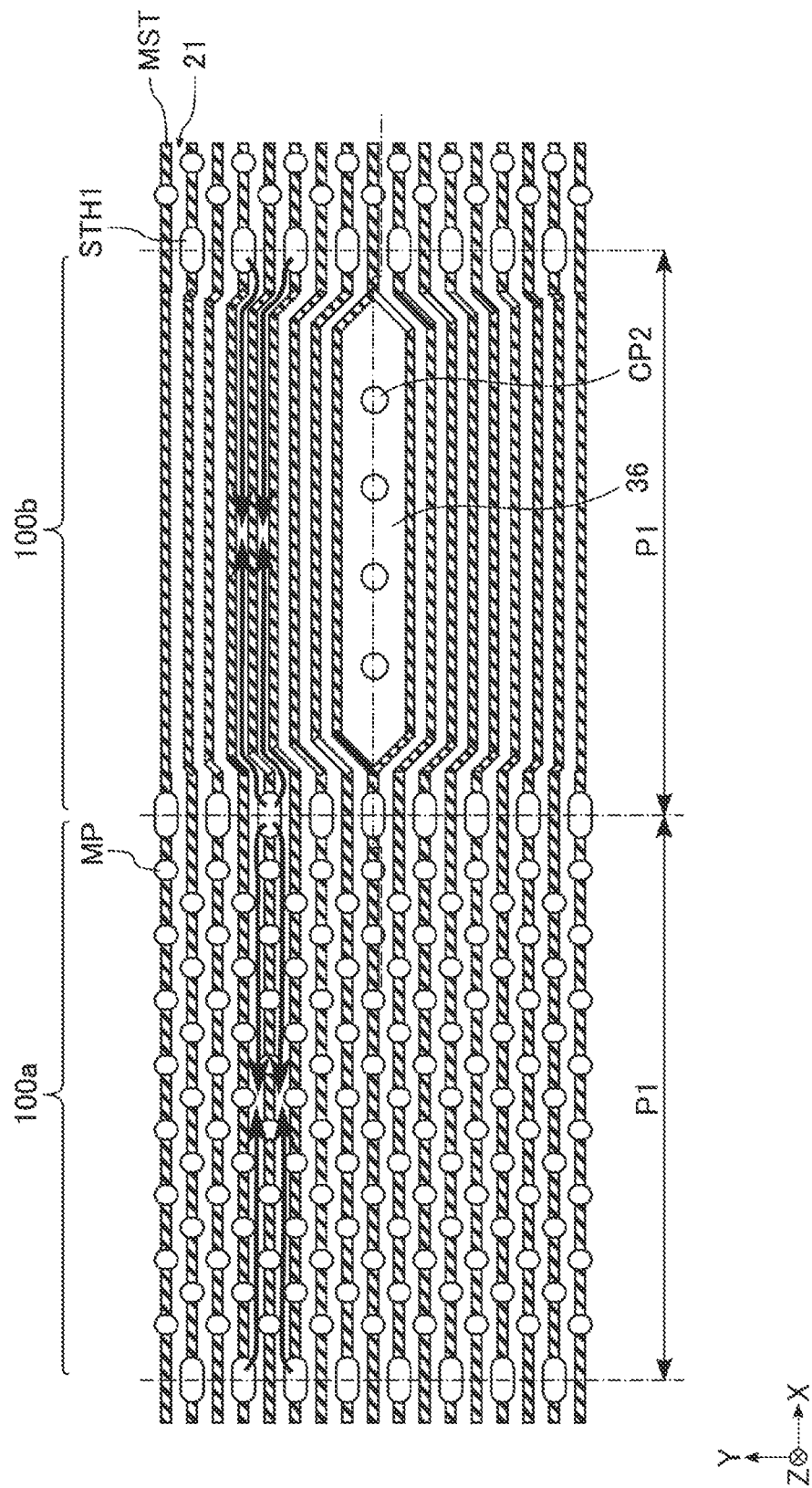
FIG. 16 is a view illustrating an arrangement of slit areas in a memory area and a contact area.

Next, the arrangement of the slit areas STH1 in the memory array area 100 will be described with reference to FIG. 16. FIG. 16 illustrates the arrangement of the slit areas STH1 in the memory area 100a and the contact area 100b.

As illustrated in FIG. 16, an arrangement interval (or arrangement pitch) P1 of the slit areas STH1 in the X direction in the memory array area 100 is set to a predetermined interval. In other words, an interval P1 at which the plurality of slit areas STH1 arranged in the Y direction at the boundary between the memory area 100a and the contact area 100b and at the boundary between the memory area 100a and another memory area 100a are arranged in the X direction is a predetermined length. That is, the plurality of slit areas STH1 arranged in the Y direction are arranged at the predetermined intervals P1 in the X direction.

In this way, in the memory array area 100 where the plurality of slit areas STH1 in the Y direction are arranged in the X direction at the equal intervals, when a removal of the sacrificial layers by etching is performed from the slit areas STH1 in the replacement process performed using the slit areas STH1, the distance to be etched is the equal distance from the slit areas STH1.

Thus, the time for which a block insulating film and others of a memory pillar are exposed to an etching solution after the removal of the sacrificial layers by etching may be shortened, so that a damage to the block insulating layer may be reduced.

Figure 17:
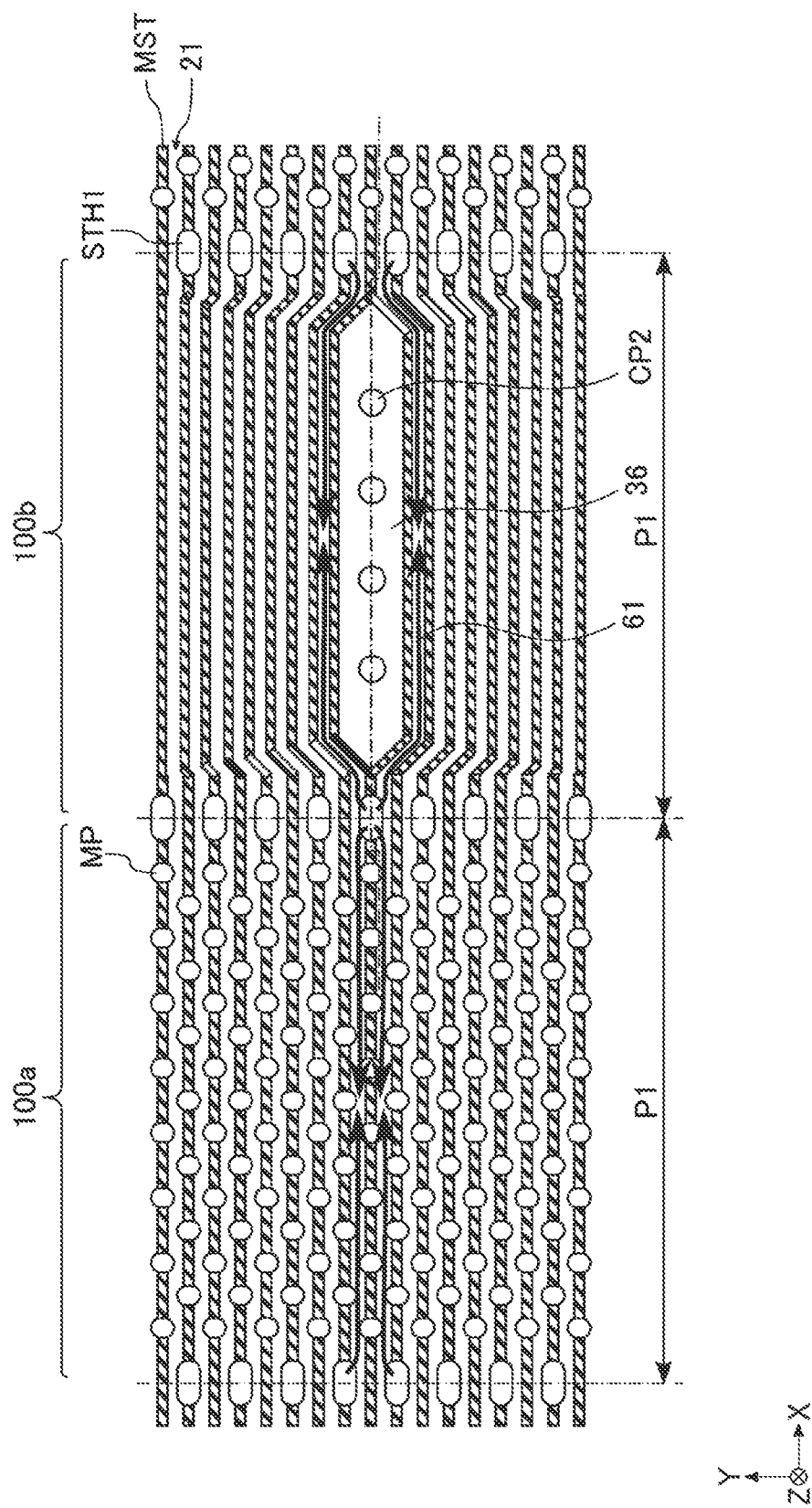
FIG. 17 is a view illustrating a replacement process using slit areas in a memory array area.

Next, descriptions will be made on a control of the replacement process for leaving the insulating layers 51 and the sacrificial layers 60 in the contact arrangement area 36 within the memory array area 100, with reference to FIG. 17. FIG. 17 is a view illustrating the control of the replacement process using the slit areas STH1 in the memory array area 100.

The planar layout illustrated in FIG. 17 is similar to the layout described in FIG. 14. As described above, the contact arrangement area 36 in which the contact plugs CP2 are arranged is surrounded by the memory trenches MST. That is, the memory trenches MST are arranged without a gap around the contact arrangement area 36.

In this layout, when the sacrificial layers 60 are removed through the slit areas SHT1 in the replacement process, the etching solution is prevented from intruding into the contact arrangement area 36 as indicated by arrows 61 in FIG. 17. Therefore, the sacrificial layers 60 within the contact arrangement area 36 are not removed, and are not replaced with the conductive layers 21. As a result, the insulating layers (e.g., silicon oxide layers) 51 and the sacrificial layers (e.g., silicon nitride layers) 60 are maintained in the stacked state within the contact arrangement area 36.

1.3 Effects of First Embodiment

According to the first embodiment, it is possible to provide a semiconductor storage device of which the operation reliability may be improved.

For example, in a semiconductor storage device having a configuration in which a peripheral circuit is provided below a memory cell array where memory cells are arranged in an array form, that is, a configuration in which a peripheral circuit is provided between a memory cell array and a semiconductor substrate, contact plugs for the connection to transistors and others of the peripheral circuit are arranged in the memory cell array. However, it may be difficult to provide an area for arranging the contact plugs for the connection to the peripheral circuit in the memory cell array area.

In the first example and its modification, the contact plug CP2 is provided in the insulating area between the blocks BLK. As a result, the upper layer wire on the memory array area 100 and the peripheral circuit below the memory array area 100 are electrically interconnected by the contact plug CP2. As a result, it is possible to improve the operation reliability of the semiconductor storage device in which the peripheral circuit is provided below the memory cell array.

In the second example, in the X direction, the contact arrangement area 36 in which the contact plugs CP2 are arranged is provided in the memory array area 100 in which memory cells are arranged. As a result, the upper layer wire above the memory array 100 and the peripheral circuit below the memory array 100 are electrically interconnected by the contact plugs CP2. As a result, it is possible to improve the operation reliability of the semiconductor storage device in which the peripheral circuit is provided below the memory cell array.

In the second example, the length of the contact area 100b in the X direction is the same as the length of the memory area 100a in the X direction. As a result, the arrangement interval P1 of the slit areas STH1 in the X direction is set to be constant in the memory array area 100.

In the replacement process performed using the slit areas STH1, the removal of the sacrificial layers (e.g., silicon nitride layers) 60 by etching is performed at an equal distance from the slit areas STH1. Therefore, in the memory array area 100 in which the slit areas STH1 are arranged at the equal intervals P1, the sacrificial layers 60 are removed by etching in substantially the same time. As a result, the time for which a block insulating layer and others of a memory pillar MP are exposed to the etching solution after the removal of the sacrificial layers 60 by etching may be shortened, so that a damage to the block insulating layer and others may be reduced.

In the second example, the memory trenches MST are arranged without a gap around the contact arrangement area 36. In this layout, in the replacement process, the etching solution for removing the sacrificial layers 60 does not intrude into the contact arrangement area 36 through the slit areas SHT1. Therefore, the sacrificial layers 60 within the contact arrangement area 36 are not removed, and are not replaced with the conductive layers 21. As a result, the insulating layers (e.g., silicon oxide layers) 51 and the sacrificial layers 60 are maintained in the stacked state within the contact arrangement area 36. As a result, the contact arrangement area 36 and other areas where contact plugs are to be provided have a cross-sectional structure in which the contact plugs CP2 may be provided using the same process.

2. Second Embodiment

Next, a semiconductor storage device according to a second embodiment will be described. The second embodiment is an example in which two conductive layers (word lines) are integrated into one conductive layer in a contact area 100b in a memory area 100a in order to form a contact arrangement area. The second embodiment will be described focusing on differences from the first embodiment. The other configurations which are not described are the same as those of the first embodiment.

As described above with reference to FIG. 4, the block BLK in the semiconductor storage device 1 includes select gate lines SGD0 to SGD7. Each of the select gate lines SGD0 to SGD7 corresponds to two conductive layers 21 corresponding to the word lines WL.

In the second embodiment, a planar layout of the conductive layers 21, as word lines, that correspond to the select gate lines SGD0 to SGD7, memory trenches MST, and memory pillars MP will be described. Hereinafter, the conductive layers 21 (word lines WL) that correspond to the select gate lines SGD0 to SGD7 will be denoted by 21(SGD0), 21(SGD1), 21(SGD2), 21(SGD3), 21(SGD4), 21(SGD5), 21(SGD6), and 21(SGD7), respectively.

2.1 Details of Layout of Memory Array Area a. First Example

Figure 18:
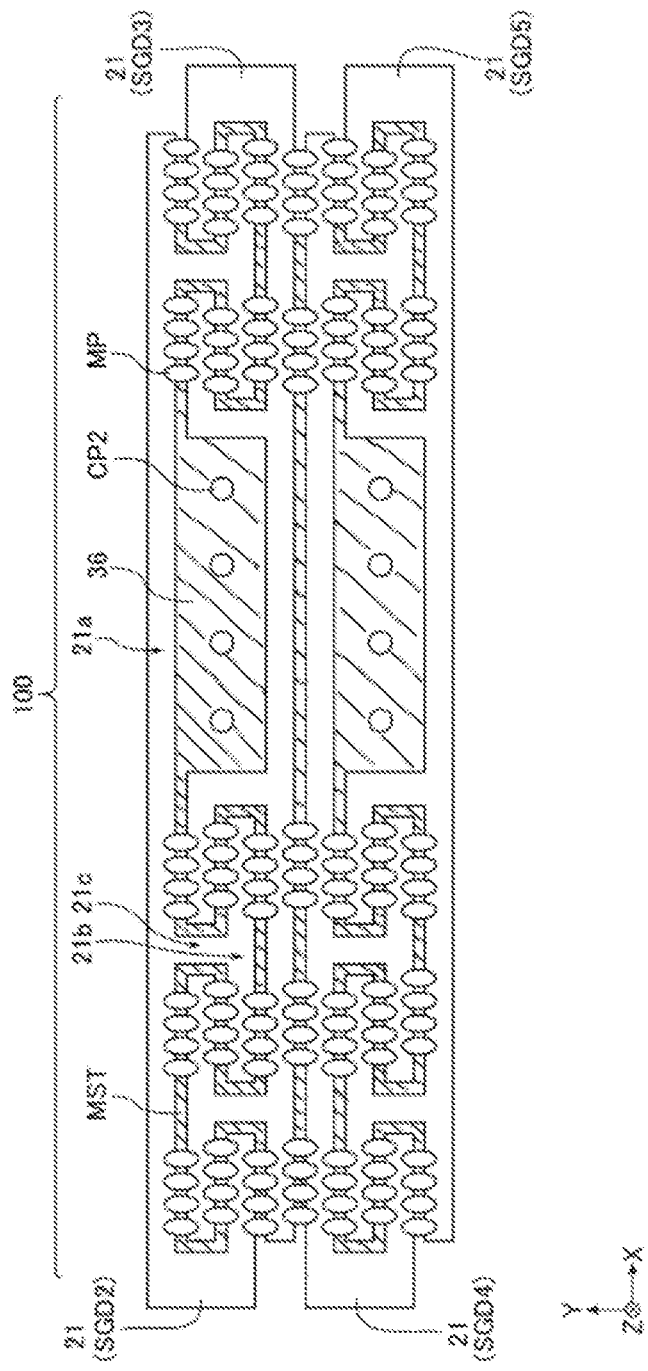
FIG. 18 is a planar layout of conductive layers, memory trenches, and memory pillars according to a first example of a second embodiment.

FIG. 18 is a planar layout of conductive layers 21, memory trenches MST, and memory pillars MP of a first example.

As illustrated in FIG. 18, for example, the conductive layers 21 (SGD2), 21 (SGD3), 21 (SGD4), and 21 (SGD5), as word lines, that correspond to the select gate lines SGD2 to SGD5 are arranged.

The conductive layer 21(SGD2) has a first portion 21a, a plurality of second portions 21b, and a plurality of third portions 21c.

The first portion 21a extends in the X direction from one end of the memory array area 100 to the other end thereof. The second portions 21b each have a predetermined length extending in the X direction, and are arranged in the X direction at a predetermined interval. The third portions 21c extend in the Y direction and are arranged in the X direction at a predetermined interval. The third portions 21c each connects the respective first portion 21a and the second portions 21b to each other. In other words, the second portions 21b are connected to one end of the first portion 21a, and are connected to the first portion 21a by the third portions 21c at a predetermined interval from the one end of the first portion 21a.

The conductive layer 21(SGD3) has the same configuration as that of the conductive layer 21(SGD2), except for the contact arrangement area, and has a point-symmetrical layout with respect to the central points of the conductive layers 21(SGD2) and 21(SGD3).

The conductive layers 21(SGD2) and 21(SGD3) are arranged so as to combine with each other in the second portion 21b. Memory pillars MP are arranged at positions where the first portion 21a and the second portion 21b of the conductive layer 21(SGD2) face with each other in the Y direction and the first portion 21a and the second portion 21b of the conductive layer 21(SGD3) face with each other in the Y direction.

Furthermore, a third portion 21c of the conductive layer 21(SGD3) is expanded in the X direction by a predetermined distance, so as to provide an area where the conductive layer 21 does not exist. The contact arrangement area 36 is provided in the area where the conductive layer 21 does not exist. One or more contact plugs CP2 are arranged in the contact arrangement area 36. Here, the third portion 21c of the conductive layer 21(SGD3) is expanded to provide the contact arrangement area 36 in which the conductive layer does not exist. However, a third portion 21c of the conductive layer 21(SGD2) may be expanded to provide the contact arrangement area 36 in which the conductive layer 21 does not exist.

The layout of the conductive layers 21(SGD4) and 21(SGD5) is the same as the layout of the conductive layers 21(SGD2) and 21(SGD3). Furthermore, the layout of the conductive layers 21(SGD0) and 21(SGD1) and the layout of the conductive layers 21(SGD6) and 21(SGD7) are also the same as the layout of the conductive layers 21(SGD2) and 21(SGD3).

Figure 19:
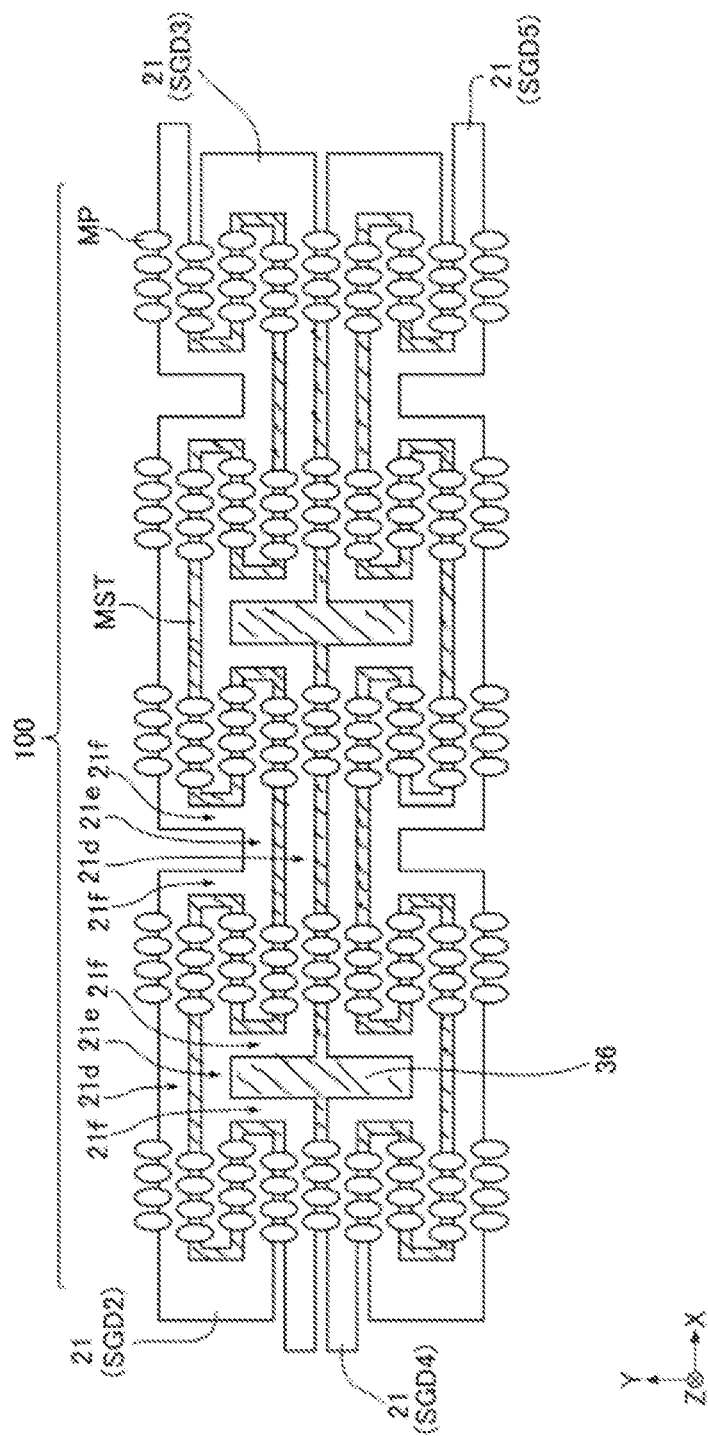
FIG. 19 is a planar layout of conductive layers, memory trenches, and memory pillars according to a second example of the second embodiment.

FIG. 19 is a planar layout of conductive layers 21, memory trenches MST, and memory pillars MP of a second example. In this case as well, the planar layout will be described using the conductive layers 21(SGD2) to 21(SGD5).

The conductive layer 21(SGD2) has a plurality of first portions 21d, a plurality of second portions 21e, and a plurality of third portions 21f.

The first portions 21d each have a predetermined length extending in the X direction and are arranged at a predetermined interval in the X direction. The second portions 21e each have a predetermined length extending in the X direction and are arranged at a predetermined interval in the X direction. The third portions 21f each have a predetermined length extending in the Y direction and are arranged at a predetermined interval in the X direction. When the planar layout illustrated in FIG. 19 is viewed from above, the left end of each first portion 21d is described as one end, and the right end thereof is described as the other end. The upper end of each third portion 21f is described as one end, and the lower end thereof is described as the other end.

Two third portions 21f form a pair, and one end of each of the pair of third portions 21f is connected to the other end of the first portion 21d and one end of another adjacent first portion 21d. The other end of each of the pair of third portions 21f is connected to the central portion of the second portion 21e. Then, a plurality of pairs of third portions 21f are arranged at predetermined intervals in the X direction, and each pair of third portions 21f connects two first portions 21d and one second portion 21e to each other.

The conductive layer 21(SGD3) has the same configuration as that of the conductive layer 21(SGD2) and has a point-symmetrical layout with respect to the central points of the conductive layers 21(SGD2) and 21(SGD3).

The conductive layers 21(SGD2) and 21(SGD3) are arranged so as to combine with each other in the first portion 21d and the second portion 21e. Memory pillars MP are arranged at positions where the first portion 21d and the second portion 21e of the conductive layer 21(SGD2) face with each other in the Y direction and the first portion 21d and the second portion 21e of the conductive layer 21(SGD3) face with each other in the Y direction.

The layout of the conductive layers 21(SGD4) and 21(SGD5) is the same as the layout of the conductive layers 21(SGD2) and 21(SGD3). The conductive layers 21(SGD4) and 21(SGD5) have a layout in which the conductive layers 21(SGD2) and 21(SGD3) are arranged to be axisymmetric with each other with respect to a straight line parallel to the X direction.

Furthermore, an area where the conductive layer 21 does not exist is provided between the pair of third portions 21*f* of the conductive layer 21(SGD3) and between the pair of third portions 21*f* of the conductive layer 21(SGD4). The contact arrangement area 36 is disposed in the area where the conductive layer 21 does not exist. One or more contact plugs CP2 are arranged in the contact arrangement area 36. Details of the contact arrangement area 36 will be described later.

Figure 20:
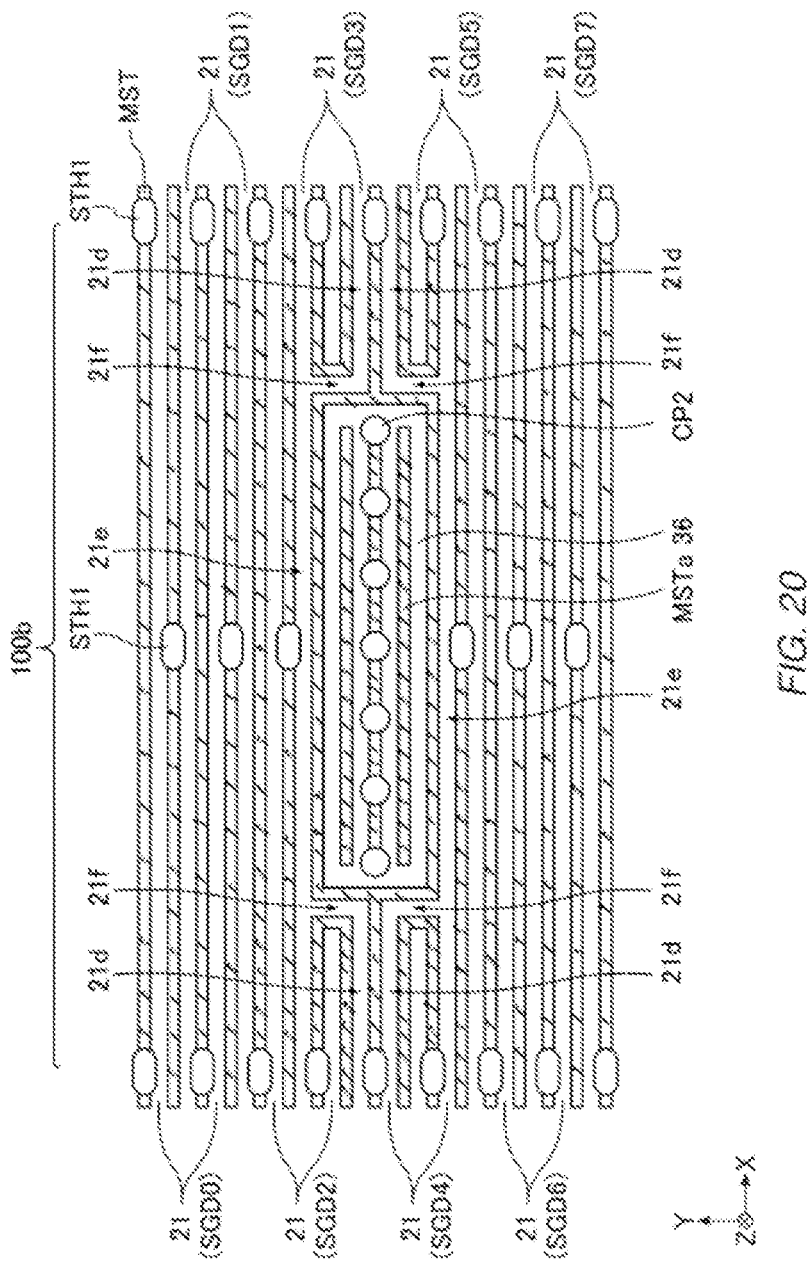
FIG. 20 is a planar layout of conductive layers including a contact arrangement area illustrated in FIG. 19.

FIG. 20 is a planar layout of the conductive layers 21(SGD0) to 21(SGD7) including the contact arrangement area 36 illustrated in FIG. 19.

At the one end side of the contact area 100*b*, the second portion 21*e* and the first portion 21*d* of the conductive layer 21(SGD3) extend in the X direction, and the first portion 21*d* bends in the Y direction to form the third portion 21*f*. The third portion 21*f* extends in the Y direction and is connected to the second portion 21*e*. The second portion 21*e* connected to the third portion 21*f* further extends in the X direction. At the other end side of the contact area 100*b*, the second portion 21*e* extends in the X direction and branches in the Y direction to form the third portion 21*f*. Furthermore, the third portion 21*f* extends in the Y direction and is connected to the first portion 21*d*. That is, the second portion 21*e* and the first portion 21*d* of the conductive layer 21(SGD3) are integrated into one second portion 21*e* near the one end of the contact area 100*b*, and branches into the second portion 21*e* and the first portion 21*d* near the other end of the contact area 100*b*.

At the other end side of the contact area 100*b*, the second portion 21*e* and the first portion 21*d* of the conductive layer 21(SGD4) extend in the X direction, and the first portion 21*d* bends in the Y direction to form the third portion 21*f*. The third portion 21*f* extends in the Y direction and is connected to the second portion 21*e*. The second portion 21*e* connected to the third portion 21*f* further extends in the X direction. At the one end side of the contact area 100*b*, the second portion 21*e* extends in the X direction and branches in the Y direction to form the third portion 21*f*. Furthermore, the third portion 21*f* extends in the Y direction and is connected to the first portion 21*d*. That is, the second portions 21*e* and the first portion 21*d* of the conductive layer 21(SGD4) are integrated into one second portion 21*e* near the other end of the contact area 100*b*, and branch into the second portion 21*e* and the first portion 21*d* near the one end of the contact area 100*b*.

The plurality of other conductive layers 21 extend in the X direction and are arranged at predetermined intervals in the Y direction. Memory trenches MST are arranged between the conductive layers 21.

A contact arrangement area (also referred to as a first area) 36 surrounded by the memory trenches MST is arranged between the conductive layers 21(SGD3) and 21(SGD4) and between the first portions 21*d* of the one end and the other end of the contact area 100*b*. One or more contact plugs CP2 are arranged in the contact arrangement area 36.

In addition, one or more dummy memory trenches MSTa may be arranged in the contact arrangement area 36. The dummy memory trench MSTa extends along the X direction and the Z direction (or the XZ plane) and reaches the conductive layer 50 from the upper layer of the conductive layer 20. The dummy memory trench MSTa is an insulating area (or insulating layer), and includes, for example, a silicon oxide layer. Memory pillars MP are not arranged in the dummy memory trench MSTa.

The slit areas STH1 are arranged in the Y direction at the one end and the other end in the contact area 100*b*. Furthermore, the slit areas STH1 are arranged in the Y direction at a substantially central portion between the one end and the other end in the contact area 100*b*. The width of each slit area STH1 extending in the Y direction is longer than the width of the memory trench MST extending in the Y direction.

In addition, a memory area 100*a* (also referred to as a second area) is provided apart from the contact arrangement area 36 in the X direction. Memory pillars MP that penetrate the memory trenches MST in the Z direction are provided in the memory area 100*a*.

As illustrated in FIG. 20, the contact area 100*b* may be provided in an area which is twice the arrangement interval P1 of the slit areas STH1 in the X direction, or may be provided in an area of the arrangement interval P1 of the slit areas STH1.

c. Third Example

Figure 21:
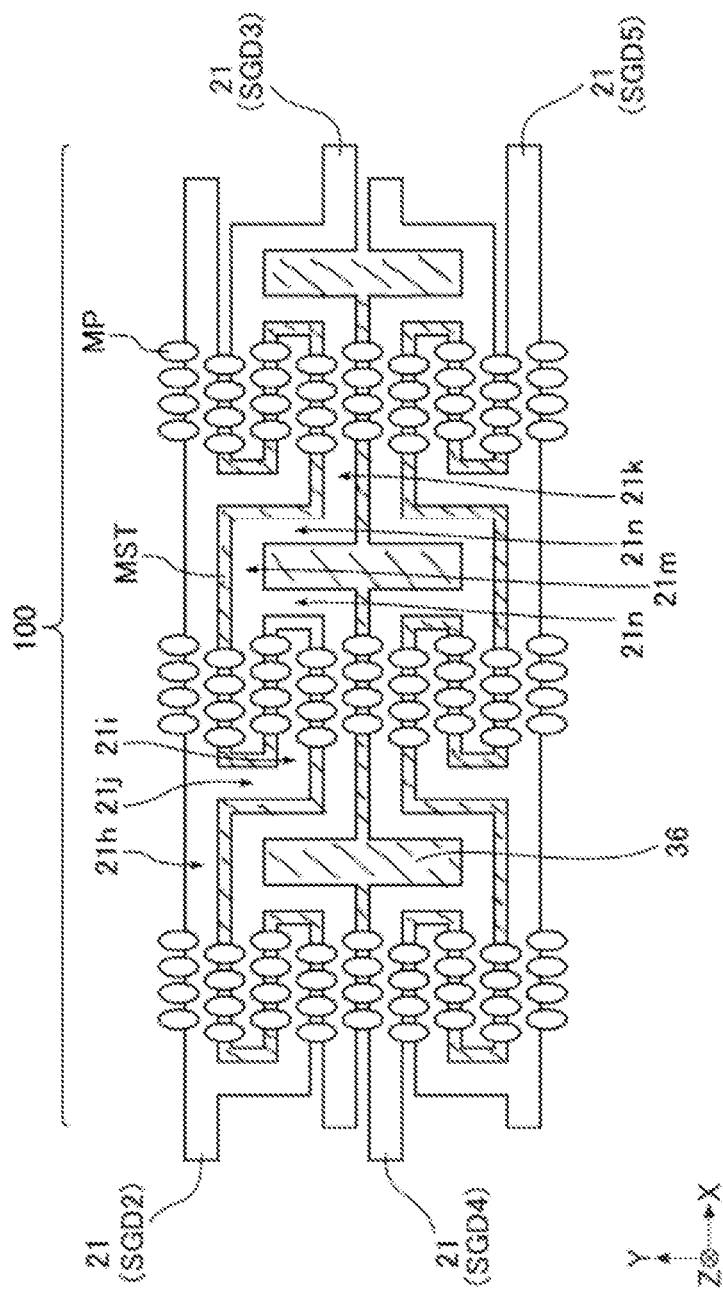
FIG. 21 is a planar layout of conductive layers, memory trenches, and memory pillars according to a third example of the second embodiment.

FIG. 21 is a planar layout of conductive layers 21, memory trenches MST, and memory pillars MP of a third example. In this case as well, the planar layout is described using the conductive layers 21(SGD2) to 21(SGD5).

The conductive layer 21(SGD2) has a first portion 21*h*, a plurality of second portions 21*i*, and a plurality of third portions 21*j*.

The first portion 21*h* extends in the X direction from one end of the memory array area 100 to the other end thereof. The second portions 21*i* each have a predetermined length extending in the X direction, and are arranged at a predetermined interval in the X direction. The third portions 21*j* each have a predetermined length extending in the Y direction, and are arranged at a predetermined interval in the X direction. When the planar layout illustrated in FIG. 21 is viewed from above, the left end of each second portion 21*i* is described as one end, and the right end thereof is described as the other end. The upper end of each third portion 21*j* is described as one end, and the lower end thereof is described as the other end.

One end of each of the third portions 21*j* is connected to the first portion 21*h*, and the other end of each of the third portions 21*j* is connected to one end of the second portion 21*i*. In other words, the one end of the second portion 21*i* is connected to the other end of the third portion 21*j*, and the one end of the third portion 21*j* is connected at a predetermined interval to the first portion 21*h* that extends in the X direction.

The conductive layer 21(SGD3) has a plurality of first portions 21*k*, a plurality of second portions 21*m*, and a plurality of third portions 21*n*. The first portions 21*k* each have a predetermined length extending in the X direction, and are arranged at a predetermined interval in the X direction. The second portions 21*m* each have a predetermined length extending in the X direction, and are arranged at a predetermined interval in the X direction. The third portions 21*n* each have a predetermined length extending in the Y direction, and are arranged at a predetermined interval in the X direction. When the planar layout illustrated in FIG. 21 is viewed from above, the left end of each first portion 21*k* is described as one end, and the right end thereof is described as the other end. The left end of each second portion 21*m* is described as one end, and the right end thereof is described as the other end. The upper end of each third portion 21*n* is described as one end, and the lower end thereof is described as the other end.

Two third portions 21*n* form a pair, and one end of each of the pair of third portions 21*n* is connected to the other end of the second portion 21*m*. The other end of each of the pair of third portions 21n is connected to the other end of the first portion 21k and one end of another adjacent first portion 21k. Then, a plurality of pairs of third portions 21n are arranged at predetermined intervals in the X direction, and each pair of third portions 21n connects two first portions 21k and one second portion 21m to each other.

The conductive layers 21(SGD2) and 21(SGD3) are arranged so as to combine with each other in the first portion 21h and the second portion 21i, and the first portion 21k and the second portion 21m. Memory pillars MP are arranged at positions where the first portion 21h and the second portion 21i of the conductive layer 21(SGD2) face with each other in the Y direction and the first portion 21k and the second portion 21m of the conductive layer 21(SGD3) face with each other in the Y direction.

The layout of the conductive layer 21(SGD4) is the same as the layout of the conductive layer 21(SGD3). The layout of the conductive layer 21(SGD5) is the same as the layout of the conductive layer 21(SGD2). The conductive layers 21(SGD4) and 21(SGD5) have a layout in which the conductive layers 21(SGD2) and 21(SGD3) are arranged to be axisymmetric with each other with respect to a straight line parallel to the X direction.

Furthermore, an area where the conductive layer 21 does not exist is provided between the pair of third portions 21n of the conductive layer 21(SGD3) and between the pair of third portions 21n of the conductive layer 21(SGD4). The contact arrangement area 36 is disposed in the area where the conductive layer 21 does not exist. One or more contact plugs CP2 are arranged in the contact arrangement area 36. Details of the contact arrangement area 36 will be described later.

Figure 22:
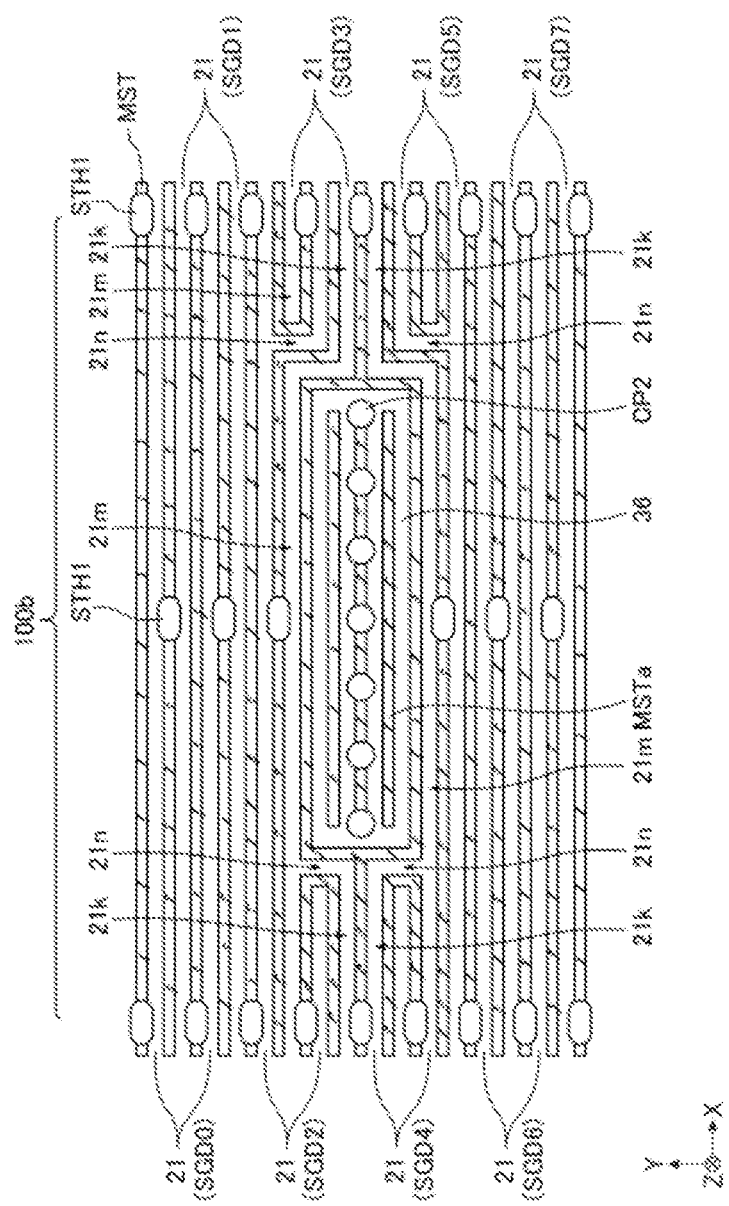
FIG. 22 is a planar layout of conductive layers including a contact arrangement area illustrated in FIG. 21.

FIG. 22 is a planar layout of the conductive layers 21(SGD0) to 21(SGD7) including the contact arrangement area 36 illustrated in FIG. 21.

At the one end side of the contact area 100b, the second portion 21m of the conductive layer 21(SGD3) extends in the X direction to become an end near the one end of the contact area 100b. The first portion 21k extends in the X direction, and bends in the Y direction to form the third portion 21n. The third portion 21n extends in the Y direction and is connected to the second portion 21m. The second portion 21m connected to the third portion 21n further extends in the X direction. At the other end side of the contact area 100b, the second portion 21m extends in the X direction and branches in the Y direction to form the third portion 21n. Furthermore, the third portion 21n extends in the Y direction and is connected to the first portion 21k. Furthermore, the first portion 21k extends in the X direction. That is, the second portion 21m and the first portion 21k of the conductive layer 21(SGD3) become one second portion 21m near the one end of the contact area 100b, and branch into the second portion 21m and the first portion 21k near the other end of the contact area 100b.

At the other end side of the contact area 100b, the second portion 21m and the first portion 21k of the conductive layer 21(SGD4) extend in the X direction, and the first portion 21k bends in the Y direction to form the third portion 21n. The third portion 21n extends in the Y direction and is connected to the second portion 21m. The second portion 21m connected to the third portion 21n further extends in the X direction. At the one end side of the contact area 100b, the second portion 21m bends in the Y direction to form the third portion 21n. The third portion 21n extends in the Y direction and further bends in the X direction to form the first portion 21k. Furthermore, the first portion 21k extends in the X direction. That is, the second portions 21m and the first portion 21k of the conductive layer 21(SGD4) are integrated into one second portion 21m near the other end of the contact area 100b and is maintained as one second portion 21m to the portion near to the one end of the contact area 100b.

The plurality of other conductive layers 21 extend in the X direction and are arranged at predetermined intervals in the Y direction. Memory trenches MST are arranged among the conductive layers 21.

A contact arrangement area 36 surrounded by the memory trenches MST is disposed between the conductive layers 21(SGD3) and 21 (SGD4) and between the first portions 21k of the one end and the other end of the contact area 100b. One or more contact plugs CP2 are arranged in the contact arrangement area 36.

One or more dummy memory trenches MSTa may be arranged in the contact arrangement area 36.

In addition, the memory area 100a is provided apart from the contact arrangement area 36 in the X direction. Memory pillars MP that penetrate the memory trenches MST in the Z direction are provided in the memory area 100a.

d. Fourth Example

Figure 23:
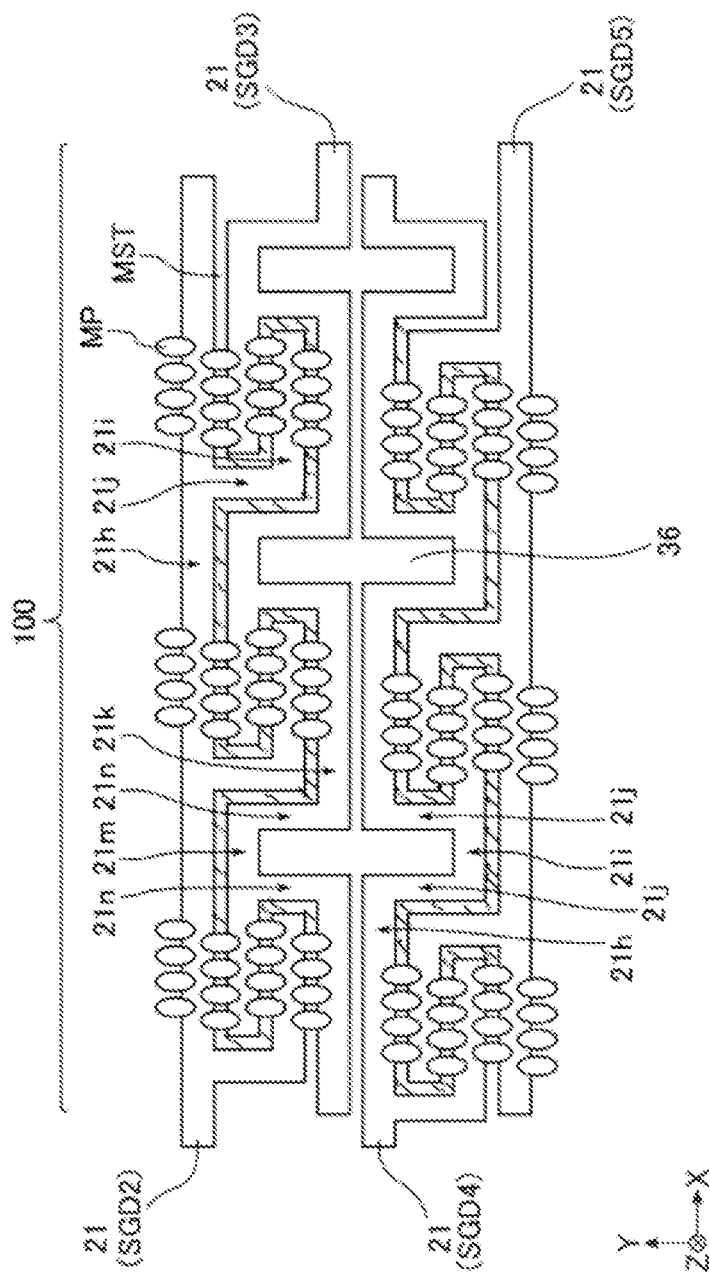
FIG. 23 is a planar layout of conductive layers, memory trenches, and memory pillars according to a fourth example of the second embodiment.

FIG. 23 is a planar layout of conductive layers 21, memory trenches MST, and memory pillars MP of a fourth example. In this case as well, the planar layout is described using the conductive layers 21(SGD2) to 21(SGD5).

The layout of the conductive layer 21(SGD2) is the same as the layout of the conductive layer 21(SGD2) of the third example, and the layout of the conductive layer 21(SGD3) is the same as the layout of the conductive layer 21(SGD3) of the third example.

The layout of the conductive layer 21(SGD4) is the same as the layout of the conductive layer 21(SGD2) of the third example except that, in the layout of the conductive layer 21(SGD2) of the third example, the third portion 21j is divided into two (one pair of) third portions 21j and the space between the two third portions 21j is expanded. The layout of the conductive layer 21(SGD5) is the same as the conductive layer 21(SGD3) of the third example except that, in the layout of the conductive layer 21(SGD3) of the third example, there is no area between the two (one pair of) third portions 21n and the two third portions 21n become one third portion 21n.

The conductive layers 21(SGD4) and 21(SGD5) are arranged such that the third portions 21j of the conductive layers 21(SGD4) and 21(SGD5) coincide with one pair of third portions 21n of the conductive layers 21(SGD2) and 21(SGD3) in the Y direction.

Further, an area where the conductive layer 21 does not exist is provided between the pair of third portions 21n of the conductive layer 21(SGD3) and between the pair of third portions 21j of the conductive layer 21(SGD4). The contact arrangement area 36 is disposed in the area where the conductive layer 21 does not exist. One or more contact plugs CP2 are arranged in the contact arrangement area 36. Details of the contact arrangement area 36 will be described later.

Figure 24:
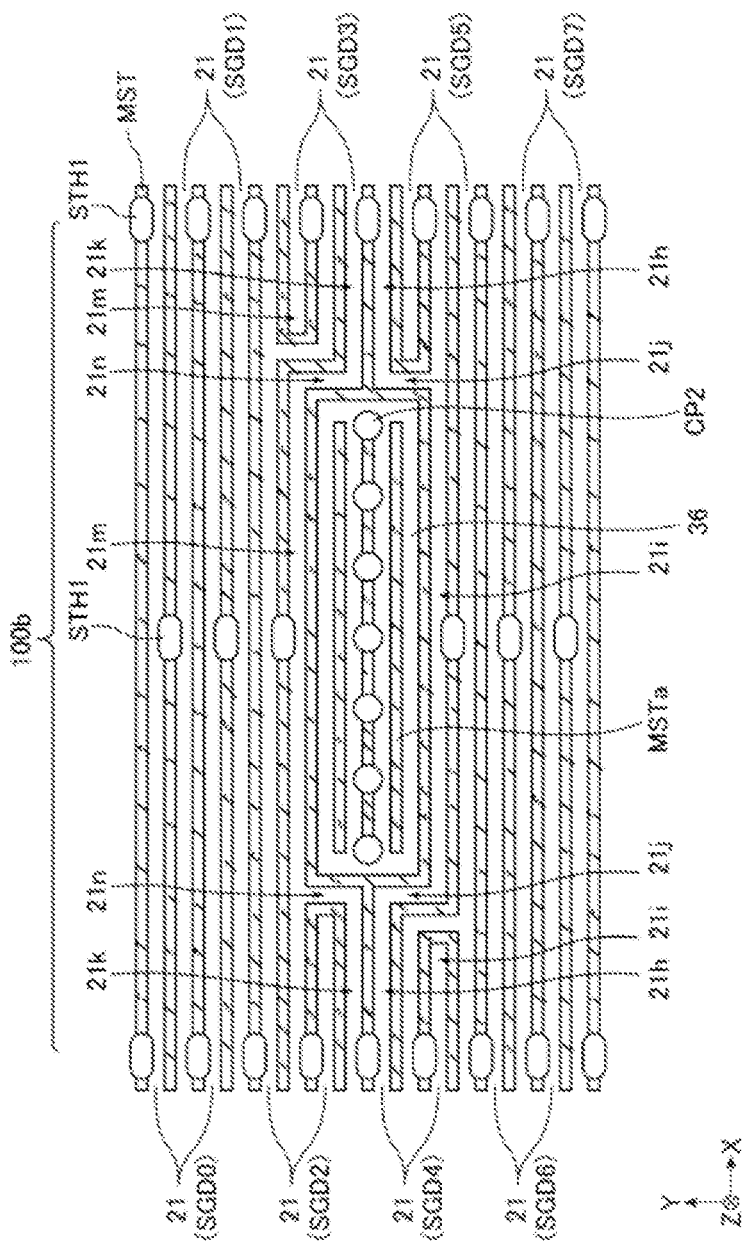
FIG. 24 is a planar layout of conductive layers including a contact arrangement area illustrated in FIG. 23.

FIG. 24 is a planar layout of the conductive layers 21(SGD0) to 21(SGD7) including the contact arrangement area 36 illustrated in FIG. 23.

At the one end side of the contact area 100b, the second portion 21m of the conductive layer 21(SGD3) extends in the X direction to become an end near the one end of the contact area 100b. The first portion 21k extends in the X direction, and bends in the Y direction to form the third portion 21n. The third portion 21n extends in the Y direction and is connected to the second portion 21m. The second portion 21m connected to the third portion 21n further extends in the X direction. At the other end side of the contact area 100b, the second portion 21m extends in the X direction and branches in the Y direction to form the third portion 21n. Furthermore, the third portion 21n extends in the Y direction and is connected to the first portion 21k. That is, the second portion 21m of the conductive layer 21(SGD3) becomes an end near the one end of the contact area 100b, and the first portion 21k of the conductive layer 21(SGD3) becomes the second portion 21m near the one end of the contact area 100b and branches into the second portion 21m and the first portion 21k near the other end of the contact area 100b.

At the other end side of the contact area 100b, the second portion 21i of the conductive layer 21(SGD4) extends in the X direction to become an end near the other end of the contact area 100b. The first portion 21h extends in the X direction, and bends in the Y direction to form the third portion 21j. The third portion 21j extends in the Y direction and is connected to the second portion 21i. The second portion 21i connected to the third portion 21j further extends in the X direction. At the one end side of the contact area 100b, the second portion 21i extends in the X direction and branches in the Y direction to form the third portion 21j. Furthermore, the third portion 21j extends in the Y direction and is connected to the first portion 21h. That is, the second portion 21j of the conductive layer 21(SGD4) becomes an end near the other end of the contact area 100b, and the first portion 21h of the conductive layer 21(SGD4) becomes the second portion 21i near the other end of the contact area 100b and branches into the second portion 21i and the first portion 21h near the one end of the contact area 100b.

The plurality of other conductive layers 21 extend in the X direction and are arranged at predetermined intervals in the Y direction. Memory trenches MST are arranged between the conductive layers 21.

A contact arrangement area 36 surrounded by the memory trenches MST is disposed between the conductive layers 21(SGD3) and 21(SGD4) and between the first portions 21k (or first portions 21h) of the one end and the other end of the contact area 100b. One or more contact plugs CP2 are arranged in the contact arrangement area 36.

One or more dummy memory trenches MSTa may be arranged in the contact arrangement area 36.

In addition, the memory area 100a is provided apart from the contact arrangement area 36 in the X direction. Memory pillars MP that penetrate the memory trenches MST in the Z direction are provided in the memory area 100a.

e. Fifth Example

For example, in the third example illustrated in FIG. 21, the conductive layer 21(SGD2) has a first portion 21h, a second portion 21i, and a third portion 21j. The first portion 21h is a conductive layer that extends in the X direction in the memory array 100, and the second portion 21i and the third portion 21j are conductive layers that are connected to the first portion 21h at a predetermined interval and branch from the first portion 21h. Therefore, the first portion 21h may be regarded as a trunk wire, and the second portion 21i and the third portion 21j may be regarded as branch wires. In the fifth example, the wire width of the first portion 21h as the trunk wire is widened.

Figure 25:
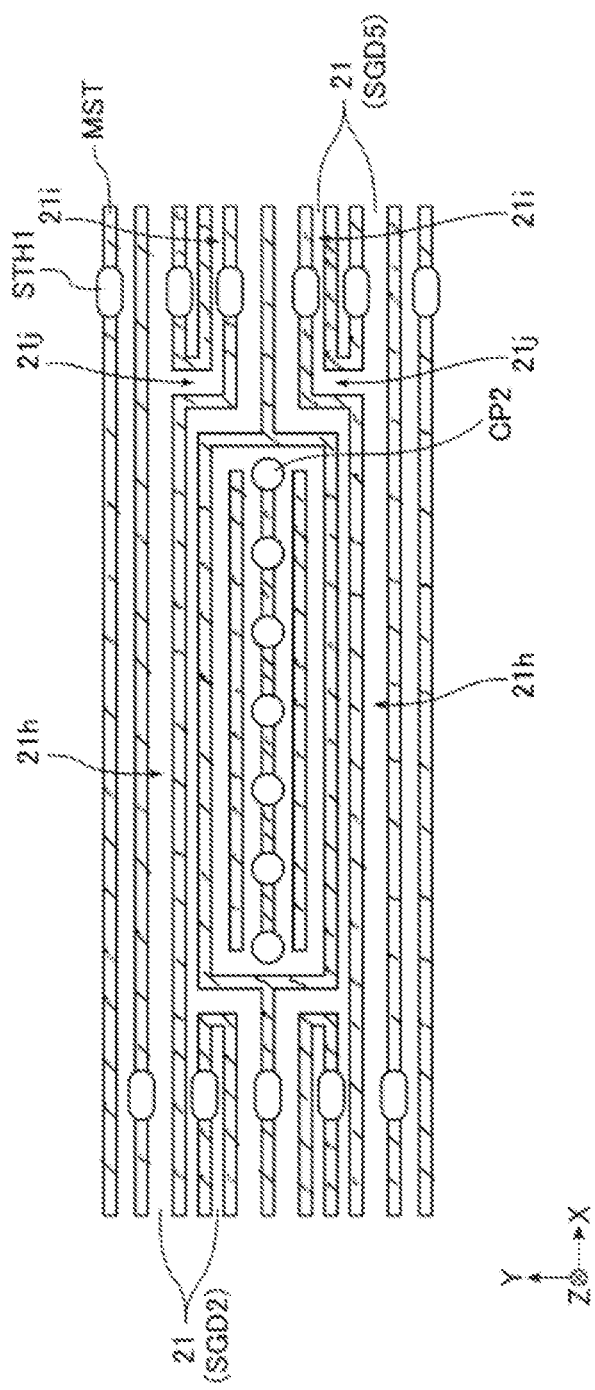
FIG. 25 is a planar layout of conductive layers and memory trenches in a fifth example of the second embodiment.

FIG. 25 is a planar layout of conductive layers 21 and memory trenches MST of the fifth example. As illustrated, the wire width of the first portion 21h as the trunk wire is made wider (or longer) than the wire width of the second portion 21i. That is, the length of the first portion 21h in the Y direction is made longer than the length of the second portion 21i in the Y direction.

In order to widen the wire width of the first portion 21h, the wire width of the second portion 21i may be narrowed. Since the second portion 21i corresponds to a branch wire, no problem occurs even when the wire width is narrowed somewhat.

2.2 Effects of Second Embodiment

According to the second embodiment, it is possible to provide a semiconductor storage device of which the operation reliability may be improved.

In the first example, the third portion 21c of the conductive layer 21(SGD3) is expanded in the X direction, such that the contact arrangement area 36 in which the conductive layer 21 does not exist is provided between the first portion 21a of the conductive layer 21(SGD3) and the first portion 21a of the conductive layer 21(SGD2).

In the layout of the first example, since there is no narrow portion between the memory trenches MST (or between the conductive layers 21), it is possible to prevent the deterioration of the operation reliability or the defect occurrence in the manufacture of a semiconductor storage device which may be caused from narrow conductive layers 21. Further, in the X direction of the memory array area 100, the contact arrangement area 36 may be provided in any of the plurality of third portions 21c. As a result, the third portion 21c in which the contact arrangement area 36 is to be provided may be freely selected, thereby improving the degree of freedom in design.

In the second example, the space between the pair of third portions 21f of the conductive layer 21(SGD3) and the conductive layer 21(SGD4) is expanded in the X direction, and the contact arrangement area 36 in which the conductive layer 21 does not exist is provided between the second portion 21e of the conductive layer 21(SGD3) and the second portion 21e of the conductive layer 21(SGD4). Furthermore, in the contact area 100b, the contact arrangement area 36 is disposed in an area provided by integrating two conductive layers into one conductive layer. As a result, the number of conductive layers may be reduced, so that a narrow portion of the distance between memory trenches MST (or between conductive layers 21) may be eliminated. Thus, it is possible to prevent the deterioration of the operation reliability or the defect occurrence in the manufacture of a semiconductor storage device which may be caused from narrow conductive layers 21.

In the third example, the space between the pair of third portions 21n of the conductive layer 21(SGD3) and the conductive layer 21(SGD4) is expanded in the X direction, and the contact arrangement area 36 in which the conductive layer 21 does not exist is provided between the second portion 21m of the conductive layer 21(SGD3) and the second portion 21m of the conductive layer 21(SGD4). Furthermore, in the contact area 100b, the contact arrangement area 36 is disposed in an area provided by integrating two conductive layers into one conductive layer. As a result, the number of conductive layers may be reduced, so that a narrow portion of the distance between memory trenches MST (or between conductive layers 21) may be eliminated. Further, the second portion 21i (or 21m) and the third portion 21j (or 21n) branch from the first portion 21h (or 21k) in the direction in which a current flows in the conductive layer 21. Therefore, a delay due to the wire resistance and the wire capacitance of the conductive layer 21 as the word line WL may be reduced. Thus, it is possible to prevent the deterioration of the operation reliability or the defect occurrence in the manufacture of a semiconductor storage device which may be caused from narrow conductive layers 21.

In the fourth example, the space between the pair of third portions 21n of the conductive layer 21(SGD3) and the space between the pair of third portions 21j of the conductive layer 21(SGD4) are expanded in the X direction, and the contact arrangement area 36 in which the conductive layer 21 does not exist is provided between the second portion 21m of the conductive layer 21(SGD3) and the second portion 21i of the conductive layer 21(SGD4). Furthermore, in the contact area 100b, the contact arrangement area 36 is disposed in an area provided by integrating two conductive layers into one conductive layer. As a result, the number of conductive layers may be reduced, so that a narrow portion of the distance between memory trenches MST (or between conductive layers 21) may be eliminated. Further, the second portion 21i (or 21m) and the third portion 21j (or 21n) branch from the first portion 21h (or 21k) in the direction in which a current flows in the conductive layer 21. Therefore, a delay due to the wire resistance and the wire capacitance of the conductive layer 21 as the word line WL may be reduced. Thus, it is possible to prevent the deterioration of the operation reliability or the defect occurrence in the manufacture of a semiconductor storage device which may be caused from narrow conductive layers 21.

In the fifth example, among the first portion 21h, the second portion 21i, and the third portion 21j of the conductive layer 21, the wire width of the first portion 21h corresponding to a trunk wire (or main wire) is set to be wider than the wire width of the second portion 21i corresponding to a branch wire. As a result, the wire resistance and signal delay of the conductive layer 21 as the word line WL may be reduced.

The other effects are the same as those of the first embodiment described above.

3. Other Modifications

In the above-described embodiments, a NAND type flash memory has been described as an example of the semiconductor storage device. However, the present disclosure is not limited to the NAND flash memory, but may be applied to other general semiconductor memories and may be further applied to various memory devices other than the semiconductor storage device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
    a plurality of first conductive layers, provided on a substrate, that extends in a first direction and extends in a second direction orthogonal to the first direction;
    a plurality of second conductive layers, provided on the substrate, that extends in the first direction and the second direction, and are separated from the plurality of first conductive layers in a third direction orthogonal to the second direction;
    a first insulating layer, arranged between the plurality of first conductive layers and the plurality of second conductive layers, that extends in the first direction and the second direction;
    a plurality of first pillars, arranged in the first insulating layer along the second direction, that extend in the first direction;
    a plurality of third conductive layers, provided on the substrate in the first direction, that extend in the second direction and are separated from the second conductive layer in the third direction;
    a plurality of fourth conductive layers, provided on the substrate in the first direction, that extend in the second direction and are separated from the plurality of third conductive layers in the third direction;
    a second insulating layer, arranged between the plurality of third conductive layers and the plurality of fourth conductive layers, that extends in the first direction and the second direction;
    a plurality of second pillars, arranged in the second insulating layer along the second direction, that extend in the first direction; and
    a contact plug, provided in the second insulating layer, that extends in the first direction,
    wherein a width of the second insulating layer in the third direction is greater than a width of the first insulating layer in the third direction.

2. The semiconductor storage device according to claim 1, further comprising:
    a plurality of first insulating portions, arranged either in the first insulating layer or the second insulating layer, that extend in the first direction,
    wherein the contact plug is arranged on a line along the third direction passing through the first insulating portions.

3. The semiconductor storage device according to claim 2, wherein the second insulating layer has a plurality of insulating layers,
    the device further comprising:
    a second insulating portion, provided between the plurality of insulating layers, that extends in the first direction; and
    a bit line, provided above the first pillar, that is electrically connected to the first pillar,
    wherein the second insulating portion is arranged between the bit line and the substrate.

4. The semiconductor storage device according to claim 2, wherein a width of each of the first insulating portions in the third direction is greater than the width of the first insulating layer in the third direction.

5. The semiconductor storage device according to claim 2, wherein the contact plug and the first insulating portions are aligned along the third direction.

6. The semiconductor storage device according to claim 1, wherein each of the plurality of first pillars is configured as a plurality of memory cell transistors.

* * * * *